United States Patent
Chen et al.

(10) Patent No.: US 10,784,289 B2
(45) Date of Patent: Sep. 22, 2020

(54) ARRAY SUBSTRATE, DISPLAY APPARATUS, PIXEL DRIVING CIRCUIT, METHOD FOR DRIVING IMAGE DISPLAY IN DISPLAY APPARATUS, AND METHOD OF FABRICATING ARRAY SUBSTRATE

(71) Applicants: Chongqing BOE Optoelectronics Technology Co., Ltd., Chongqing (CN); BOE TECHNOLOGY GROUP CO., LTD., Beijing (CN)

(72) Inventors: Yulong Chen, Beijing (CN); Niannian Wang, Beijing (CN); Yong Xiong, Beijing (CN); Zhichang Liu, Beijing (CN); Xiaorui Tian, Beijing (CN); Linglong Lu, Beijing (CN); Ziwei Wang, Beijing (CN); Meng Wei, Beijing (CN); Xiang Zhang, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 28 days.

(21) Appl. No.: 16/333,324

(22) PCT Filed: May 22, 2018

(86) PCT No.: PCT/CN2018/087830
§ 371 (c)(1),
(2) Date: Mar. 14, 2019

(87) PCT Pub. No.: WO2019/222910
PCT Pub. Date: Nov. 28, 2019

(65) Prior Publication Data
US 2019/0363104 A1    Nov. 28, 2019

(51) Int. Cl.
*H01L 27/12* (2006.01)
*G09G 3/3225* (2016.01)
*G09G 3/36* (2006.01)

(52) U.S. Cl.
CPC ......... *H01L 27/124* (2013.01); *G09G 3/3225* (2013.01); *G09G 3/3648* (2013.01); *H01L 27/1259* (2013.01)

(58) Field of Classification Search
CPC . H01L 27/124; H01L 27/1259; G09G 3/3225; G09G 3/3648; G09G 3/20;
(Continued)

(56) References Cited

U.S. PATENT DOCUMENTS

| | | | | |
|---|---|---|---|---|
| 2011/0164018 A1* | 7/2011 | Kang | ........... | G09G 3/3233 345/211 |
| 2015/0243827 A1* | 8/2015 | Jung | ........... | H01L 27/1446 257/53 |
| 2017/0213506 A1* | 7/2017 | Shibusawa | ........... | G09G 3/3233 |

\* cited by examiner

*Primary Examiner* — Sitaramarao S Yechuri
(74) *Attorney, Agent, or Firm* — Intellectual Valley Law, P.C.

(57) ABSTRACT

The present application provides an array substrate. The array substrate in each of a plurality of subpixel areas includes a first thin film transistor having a first gate electrode connected to one of a plurality of gate lines, a first source electrode connected to one of a plurality of data lines, and a first drain electrode connected to a pixel electrode; a second thin film transistor having a second gate electrode, a second source electrode connected to the one of the plurality of data lines, and a second drain electrode connected to the pixel electrode; and a third thin film transistor having a third gate electrode connected to the one of the plurality of data lines, a third source electrode connected to the one of the plurality of gate lines, and a third drain electrode connected to the second gate electrode and one of a plurality of auxiliary signal lines.

20 Claims, 13 Drawing Sheets

(58) Field of Classification Search
CPC ........ G09G 2300/0814; G02F 1/13306; G02F 1/1368; G02F 1/136286; G02F 2001/136295
See application file for complete search history.

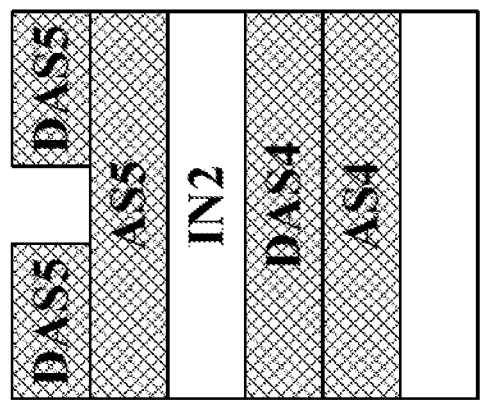
ACT2
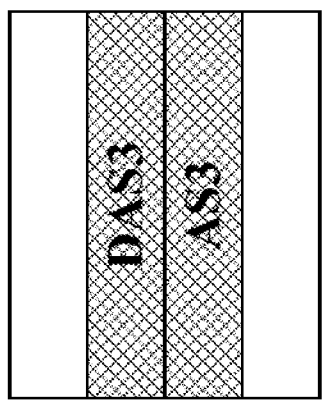
ACT3
FIG. 6
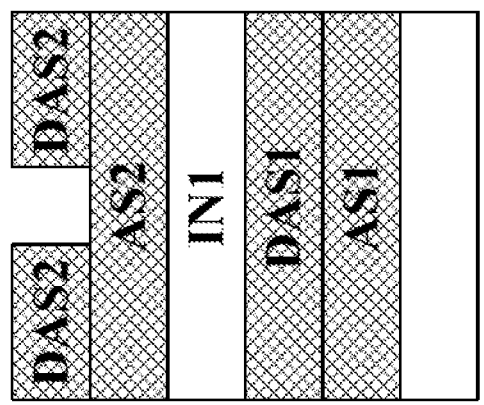
ACT1

ARRAY SUBSTRATE, DISPLAY APPARATUS, PIXEL DRIVING CIRCUIT, METHOD FOR DRIVING IMAGE DISPLAY IN DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2018/087830, filed May 22, 2018, the contents of which are incorporated by reference in the entirety.

TECHNICAL FIELD

The present invention relates to display technology, more particularly, to an array substrate having a plurality of subpixel areas, a display apparatus, a pixel driving circuit, a method for driving image display in a display apparatus, and a method of fabricating an array substrate.

BACKGROUND

Display apparatuses such as liquid crystal display (LCD) apparatuses, organic light-emitting diode (OLED) display apparatuses, and electrophoretic display (EPD) apparatuses have been widely used. Typically, the display apparatus includes an array substrate and a counter substrate assembled together. An array substrate typically includes a plurality of subpixel areas in its display area, each of the plurality of subpixel areas is controlled by a thin film transistor for image display.

SUMMARY

In one aspect, the present disclosure provides an array substrate having a plurality of subpixel areas, comprising a plurality of gate lines configured to provide a plurality of gate scanning signals respectively to the plurality of subpixel areas; a plurality of data lines configured to provide a plurality of data signals respectively to the plurality of subpixel areas; a plurality of auxiliary signal lines; and a pixel electrode; wherein the array substrate in each of the plurality of subpixel areas comprises a first thin film transistor having a first active layer, a first gate electrode connected to one of the plurality of gate lines, a first source electrode connected to one of the plurality of data lines, and a first drain electrode connected to the pixel electrode; a second thin film transistor having a second active layer, a second gate electrode, a second source electrode connected to the one of the plurality of data lines, and a second drain electrode connected to the pixel electrode; and a third thin film transistor having a third active layer, a third gate electrode connected to the one of the plurality of data lines, a third source electrode connected to the one of the plurality of gate lines, and a third drain electrode connected to the second gate electrode and one of the plurality of auxiliary signal lines.

Optionally, the plurality of auxiliary signal lines are configured to be provided with a voltage having a voltage level lower than a voltage level of a gate scanning signal provided to the one of the plurality of gate lines.

Optionally, a portion of the one of the plurality of auxiliary signal lines constitutes the second gate electrode.

Optionally, a portion of the one of the plurality of data lines constitutes the third gate electrode.

Optionally, a portion of the one of the plurality of auxiliary signal lines constitutes the third drain electrode.

Optionally, a portion of the one of the plurality of gate lines constitutes the third source electrode.

Optionally, a portion of the one of the plurality of auxiliary signal lines constitutes the second gate electrode; a portion of the one of the plurality of data lines constitutes the third gate electrode; a portion of the one of the plurality of auxiliary signal lines constitutes the third drain electrode; and a portion of the one of the plurality of gate lines constitutes the third source electrode.

Optionally, one or more of the first active layer, the second active layer, and the third active layer comprise a doped semiconductor material; and the third active layer is less doped than the first active layer and the second active layer.

Optionally, the first active layer comprises a first semiconductor sub-layer, a first doped semiconductor sub-layer on the first semiconductor sub-layer, a second semiconductor sub-layer on a side of the first doped semiconductor sub-layer distal to the first semiconductor sub-layer, and a second doped semiconductor sub-layer on a side of the second semiconductor sub-layer distal to the first doped semiconductor sub-layer; the third active layer comprises a third semiconductor sub-layer and a third doped semiconductor sub-layer on the third semiconductor sub-layer; the first semiconductor sub-layer and the third semiconductor sub-layer are in a same layer, and the first doped semiconductor sub-layer and the third doped semiconductor sub-layer are in a same layer.

Optionally, the first doped semiconductor sub-layer and the third doped semiconductor sub-layer are less doped than the second doped semiconductor sub-layer.

Optionally, the first active layer further comprises a first insulating sub-layer between the first doped semiconductor sub-layer and the second semiconductor sub-layer.

Optionally, the second active layer comprises a fourth semiconductor sub-layer, a fourth doped semiconductor sub-layer on the fourth semiconductor sub-layer, a fifth semiconductor sub-layer on a side of the fourth doped semiconductor sub-layer distal to the fourth semiconductor sub-layer, and a fifth doped semiconductor sub-layer on a side of the fifth semiconductor sub-layer distal to the fourth doped semiconductor sub-layer, wherein the first semiconductor sub-layer and the fourth semiconductor sub-layer are in a same layer; the first doped semiconductor sub-layer and the fourth doped semiconductor sub-layer are in a same layer; the second semiconductor sub-layer and the fifth semiconductor sub-layer are in a same layer; and the second doped semiconductor sub-layer and the fifth doped semiconductor sub-layer are in a same layer.

Optionally, the fourth doped semiconductor sub-layer and the third doped semiconductor sub-layer are less doped than the fifth doped semiconductor sub-layer.

Optionally, the first active layer further comprises a first insulating sub-layer between the first doped semiconductor sub-layer and the second semiconductor sub-layer; the second active layer further comprises a second insulating sub-layer between the fourth doped semiconductor sub-layer and the fifth semiconductor sub-layer; and the first insulating sub-layer and the second insulating sub-layer are in a same layer and comprise a same material.

Optionally, the first active layer, the second active layer, and the third active layer are in a same layer.

Optionally, the array substrate further comprises a common electrode; wherein the plurality of auxiliary signal lines are a plurality of common electrode signal lines; and the common electrode is connected to one of the plurality of auxiliary signal lines.

In another aspect, the present disclosure provides a display apparatus comprising the array substrate described herein or fabricated by a method described herein.

In another aspect, the present disclosure provides a pixel driving circuit, comprising a first thin film transistor having a first gate electrode connected to one of a plurality of gate lines, a first source electrode connected to one of a plurality of data lines, and a first drain electrode connected to a pixel electrode; a second thin film transistor having a second gate electrode, a second source electrode connected to the one of the plurality of data lines, and a second drain electrode connected to the pixel electrode; and a third thin film transistor having a third gate electrode connected to the one of the plurality of data lines, a third source electrode connected to the one of the plurality of gate lines, and a third drain electrode connected to the second gate electrode and one of a plurality of auxiliary signal lines; wherein the plurality of auxiliary signal lines are configured to be provided with a voltage having a voltage level lower than a voltage level of a gate scanning signal provided to the one of the plurality of gate lines.

In another aspect, the present disclosure provides a method for driving image display in a display apparatus having a plurality of subpixels wherein the display apparatus comprises a plurality of gate lines configured to provide a plurality of gate scanning signals respectively to the plurality of subpixels; a plurality of data lines configured to provide a plurality of data signals respectively to the plurality of subpixels; a plurality of auxiliary signal lines; and a pixel electrode; wherein the display apparatus in each of the plurality of subpixels comprises a first thin film transistor having a first gate electrode connected to one of the plurality of gate lines, a first source electrode connected to one of the plurality of data lines, and a first drain electrode connected to the pixel electrode; a second thin film transistor having a second gate electrode, a second source electrode connected to the one of the plurality of data lines, and a second drain electrode connected to the pixel electrode; and a third thin film transistor having a third gate electrode connected to the one of the plurality of data lines, a third source electrode connected to the one of the plurality of gate lines, and a third drain electrode connected to the second gate electrode and one of the plurality of auxiliary signal lines; wherein the method comprises providing a gate scanning signal through the one of the plurality of gate lines to the first gate electrode and the third source electrode; providing a data signal through the one of the plurality of data lines to the first source electrode, the second source electrode, and the third gate electrode; and providing a common voltage signal through the one of the plurality of auxiliary signal lines to the third drain electrode; wherein a voltage level of the common voltage signal is lower than a voltage level of the gate scanning signal.

Optionally, the data signal is configured to turn on the third thin film transistor, allowing a current to flow from the third source electrode to the third drain electrode thereby increasing a voltage level at the second gate electrode from the voltage level of the common voltage signal by an increment value.

Optionally, the gate scanning signal is configured to turn on the first thin film transistor, allowing the data signal to be transmitted to the pixel electrode through the first thin film transistor; wherein the second thin film transistor is configured to have a drain-source threshold voltage greater than a voltage difference between the second source electrode and the second drain electrode when the data signal is transmitted to the pixel electrode through the first thin film transistor, thereby maintaining the second thin film transistor in an OFF state.

Optionally, the gate scanning signal fails to turn on the first thin film transistor, and the data signal fails to be transmitted to the pixel electrode through the first thin film transistor; wherein the second thin film transistor is configured to have a drain-source threshold voltage smaller than a voltage difference between the second source electrode and the second drain electrode when the gate scanning signal fails to turn on the first thin film transistor, thereby turning on the second thin film transistor and allowing the data signal to be transmitted to the pixel electrode through the second thin film transistor.

In another aspect, the present disclosure provides a method of fabricating an array substrate, comprising forming a plurality of gate lines configured to provide a plurality of gate scanning signals respectively to a plurality of subpixel areas; forming a plurality of data lines configured to provide a plurality of data signals respectively to the plurality of subpixel areas; forming a plurality of auxiliary signal lines; and forming a pixel electrode; wherein the array substrate is formed to comprise, in each of the plurality of subpixel areas, a first thin film transistor having a first gate electrode connected to one of the plurality of gate lines, a first source electrode connected to one of the plurality of data lines, and a first drain electrode connected to the pixel electrode; a second thin film transistor having a second gate electrode, a second source electrode connected to the one of the plurality of data lines, and a second drain electrode connected to the pixel electrode; and a third thin film transistor having a third gate electrode connected to the one of the plurality of data lines, a third source electrode connected to the one of the plurality of gate lines, and a third drain electrode connected to the second gate electrode and one of the plurality of auxiliary signal lines; wherein the plurality of auxiliary signal lines are configured to be provided with a voltage having a voltage level lower than a voltage level of a gate scanning signal provided to the one of the plurality of gate lines.

BRIEF DESCRIPTION OF THE FIGURES

The following drawings are merely examples for illustrative purposes according to various disclosed embodiments and are not intended to limit the scope of the present invention.

FIG. 6 is a schematic diagram illustrating the structure of a first active layer, a second active layer, and a third active layer in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
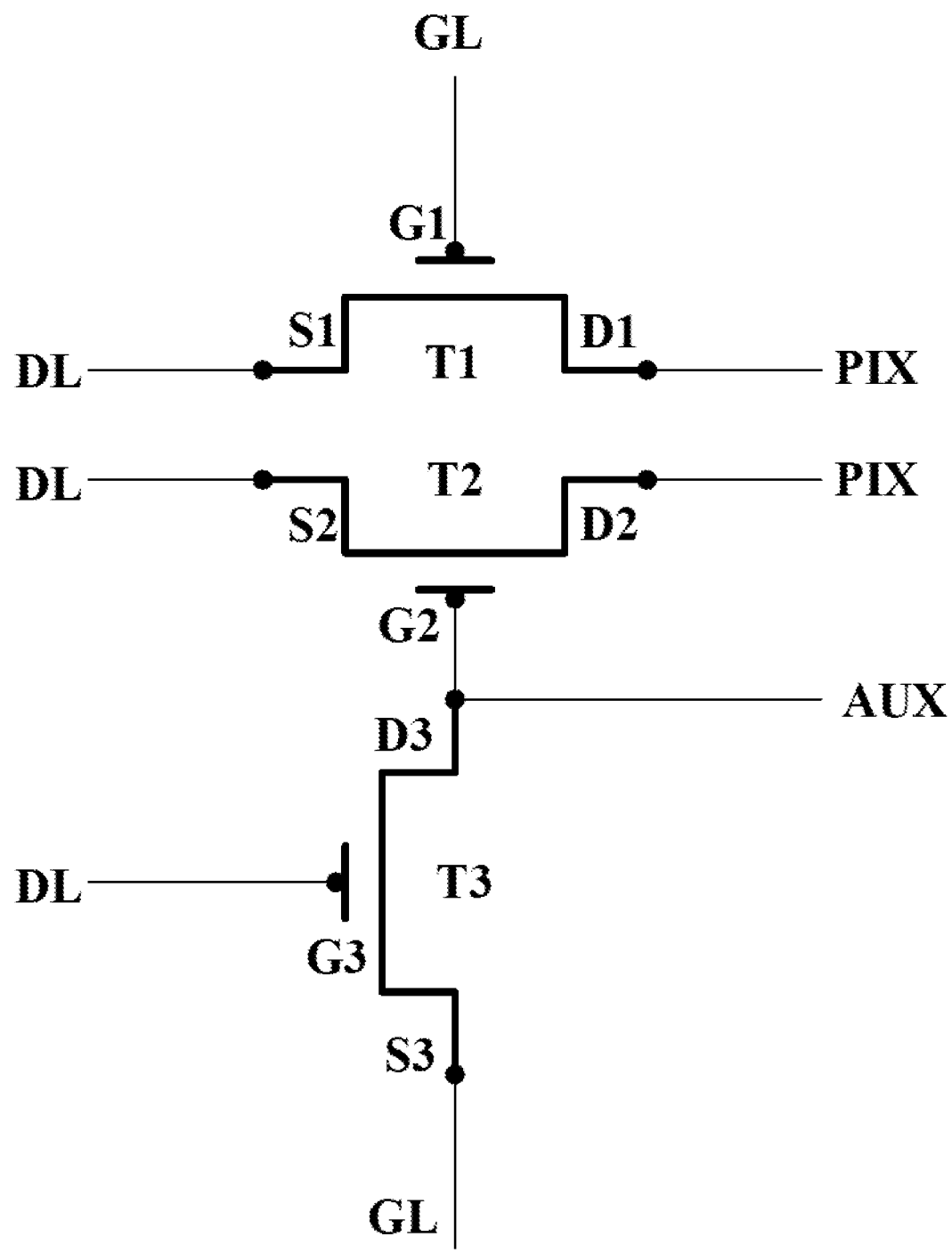
FIG. 1 is a circuit diagram of a pixel driving circuit in some embodiments according to the present disclosure.

The present disclosure provides, inter alia, an array substrate having a plurality of subpixel areas, a display apparatus, a pixel driving circuit, a method for driving image display in a display apparatus, and a method of fabricating an array substrate that substantially obviate one or more of the problems due to limitations and disadvantages of the related art. In one aspect, the present disclosure provides a pixel driving circuit. FIG. 1 is a circuit diagram of a pixel driving circuit in some embodiments according to the present disclosure. Referring to FIG. 1, the pixel driving circuit in some embodiments includes a first thin film transistor T1 having a first gate electrode G1 connected to one of a plurality of gate lines GL, a first source electrode S1 connected to one of a plurality of data lines DL, and a first drain electrode D1 connected to a pixel electrode PIX; a second thin film transistor T2 having a second gate electrode G2, a second source electrode S2 connected to the one of the plurality of data lines DL, and a second drain electrode S2 connected to the pixel electrode PIX; and a third thin film transistor T3 having a third gate electrode G3 connected to the one of the plurality of data lines DL, a third source electrode S3 connected to the one of the plurality of gate lines GL, and a third drain electrode D3 connected to the second gate electrode G2 and one of a plurality of auxiliary signal lines AUX. Optionally, the plurality of auxiliary signal lines AUX are configured to be provided with a voltage having a voltage level lower than a voltage level of a gate scanning signal provided to the one of the plurality of gate lines GL. Optionally, the plurality of auxiliary signal lines AUX are a plurality of common electrode signal lines connected to one or more common electrodes.

Optionally, a portion of the one of the plurality of auxiliary signal lines AUX constitutes the second gate electrode G2. Optionally, a portion of the one of the plurality of data lines DL constitutes the third gate electrode G3. Optionally, a portion of the one of the plurality of auxiliary signal lines AUX constitutes the third drain electrode D3. Optionally, a portion of the one of the plurality of gate lines GL constitutes the third source electrode S3. In one example, a portion of the one of the plurality of auxiliary signal lines AUX constitutes the second gate electrode G2, a portion of the one of the plurality of data lines DL constitutes the third gate electrode G3, a portion of the one of the plurality of auxiliary signal lines AUX constitutes the third drain electrode D3, and a portion of the one of the plurality of gate lines GL constitutes the third source electrode S3.

In another aspect, the present disclosure provides an array substrate having a plurality of subpixel areas. In some embodiments, the array substrate includes a plurality of gate lines configured to provide a plurality of gate scanning signals respectively to the plurality of subpixels areas; a plurality of data lines configured to provide a plurality of data signals respectively to the plurality of subpixels areas; a plurality of auxiliary signal lines; and a pixel electrode. In some embodiments, the array substrate in each of the plurality of subpixel areas includes a first thin film transistor having a first active layer, a first gate electrode connected to one of the plurality of gate lines, a first source electrode connected to one of the plurality of data lines, and a first drain electrode connected to the pixel electrode; a second thin film transistor having a second active layer, a second gate electrode, a second source electrode connected to the one of the plurality of data lines, and a second drain electrode connected to the pixel electrode; and a third thin film transistor having a third active layer, a third gate electrode connected to the one of the plurality of data lines, a third source electrode connected to the one of the plurality of gate lines, and a third drain electrode connected to the second gate electrode and one of the plurality of auxiliary signal lines.

Figure 2:
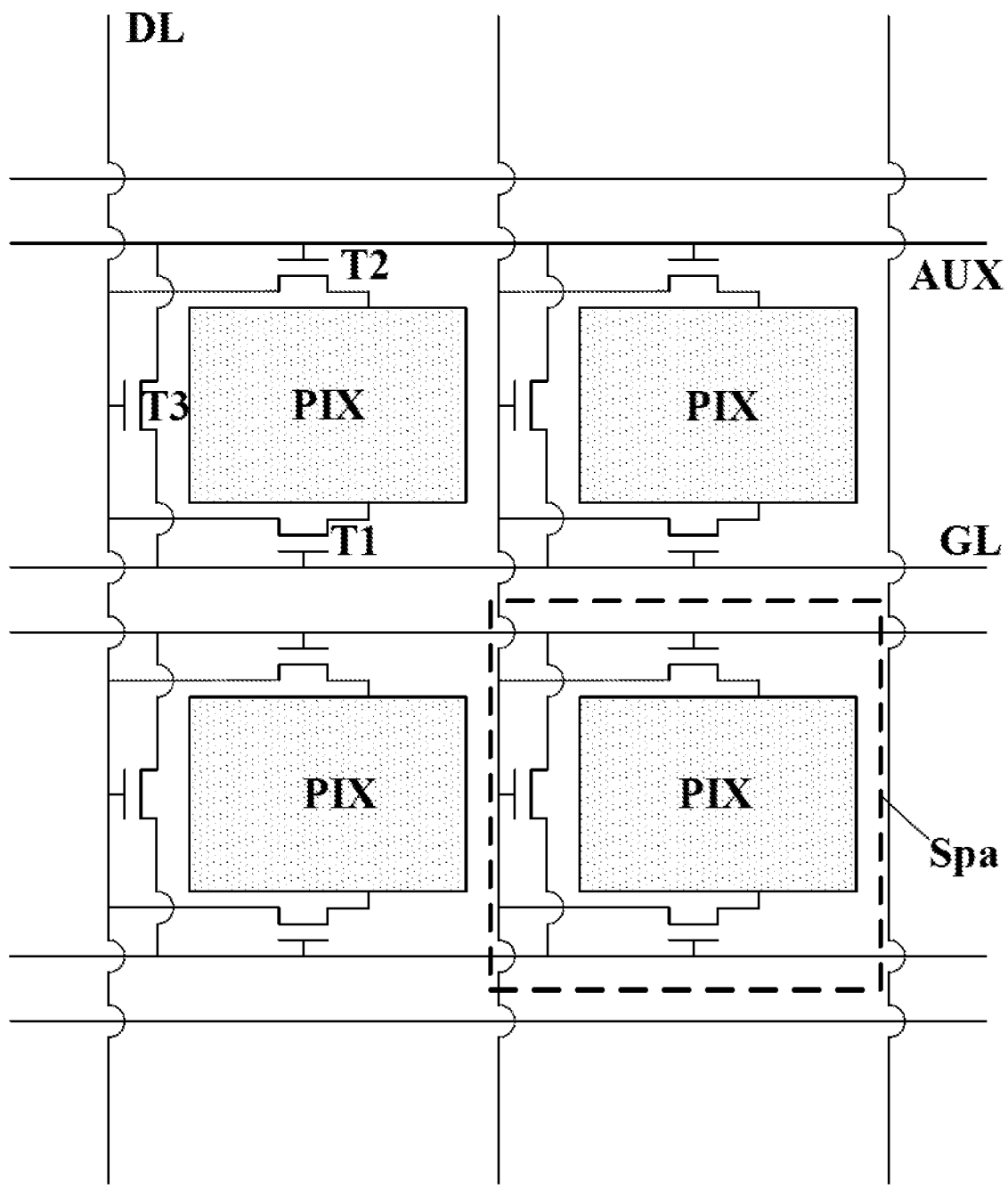
FIG. 2 is a schematic diagram illustrating the structure of an array substrate in some embodiments according to the present disclosure.

FIG. 2 is a schematic diagram illustrating the structure of an array substrate in some embodiments according to the present disclosure. Referring to FIG. 2, the array substrate has a plurality of subpixel areas Spa. The array substrate includes a plurality of gate lines GL configured to provide a plurality of gate scanning signals respectively to the plurality of subpixels areas Spa and a plurality of data lines DL configured to provide a plurality of data signals respectively to the plurality of subpixel areas Spa. The plurality of gate lines GL and the plurality of data lines DL cross over each other, thereby defining the plurality of subpixel areas Spa. The array substrate further includes a plurality of auxiliary signal lines AUX. Optionally, the plurality of auxiliary signal lines AUX are configured to be provided with a voltage having a voltage level lower than a voltage level of a gate scanning signal provided to the plurality of gate lines GL. Optionally, the plurality of auxiliary signal lines AUX are configured to be provided with a ground voltage. Optionally, the plurality of auxiliary signal lines AUX are a plurality of common electrode signal lines connected to one or more common electrodes. Optionally, the plurality of auxiliary signal lines AUX are substantially parallel to the plurality of gate lines GL. Optionally, the plurality of auxiliary signal lines AUX are substantially parallel to the plurality of data lines DL. The array substrate further includes a plurality of pixel electrodes PIX, each of which in one of the plurality of subpixel areas Spa. Optionally, the array substrate further includes a plurality of common electrodes. Optionally, the array substrate does not include a plurality of common electrodes, which are disposed in a counter substrate facing the array substrate in a display apparatus.

Figure 3:
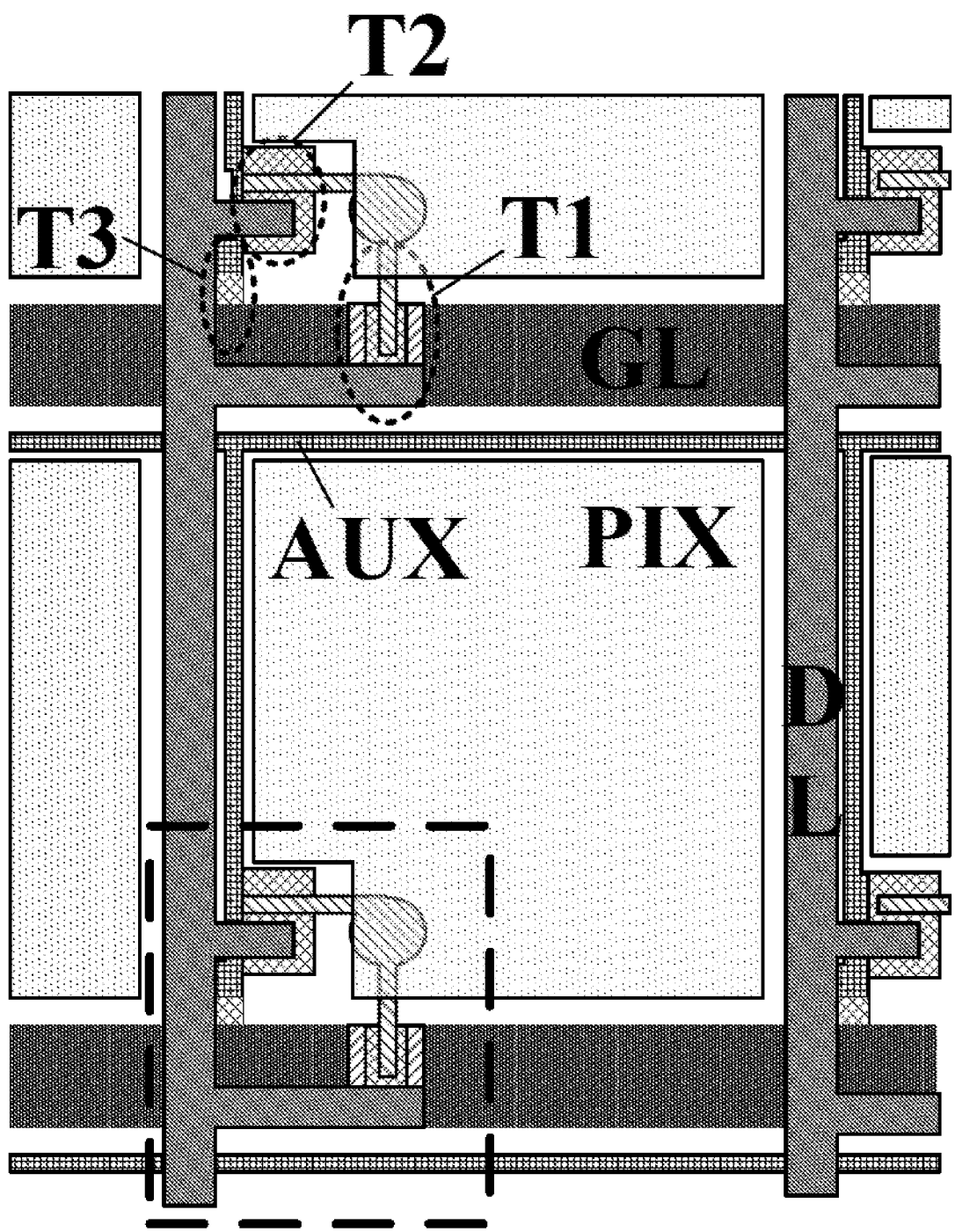
FIG. 3 is a schematic diagram illustrating the structure of an array substrate in some embodiments according to the present disclosure.
Figure 4:
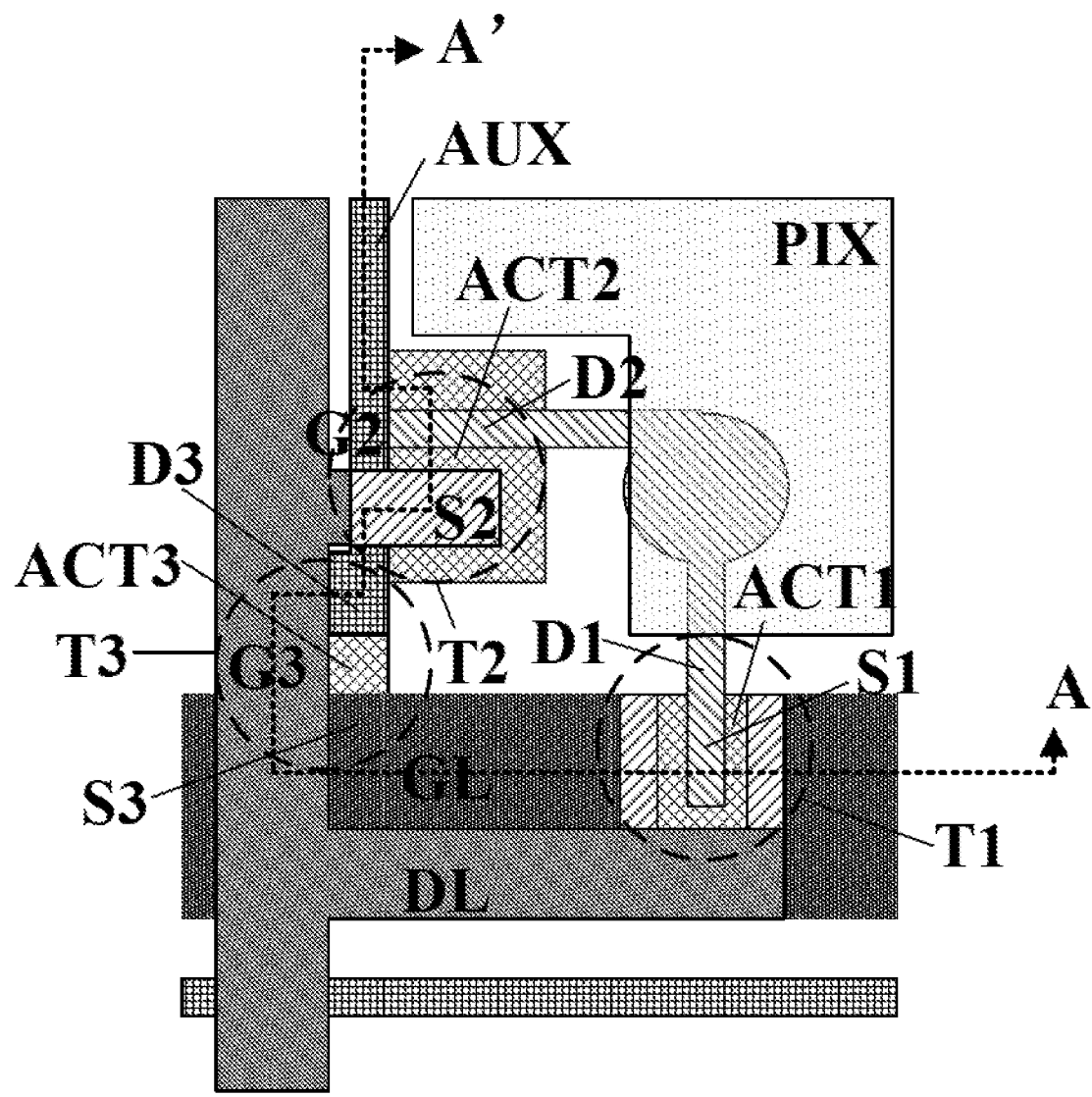
FIG. 4 is a zoom-in view of the array substrate in FIG. 3.
Figure 5:
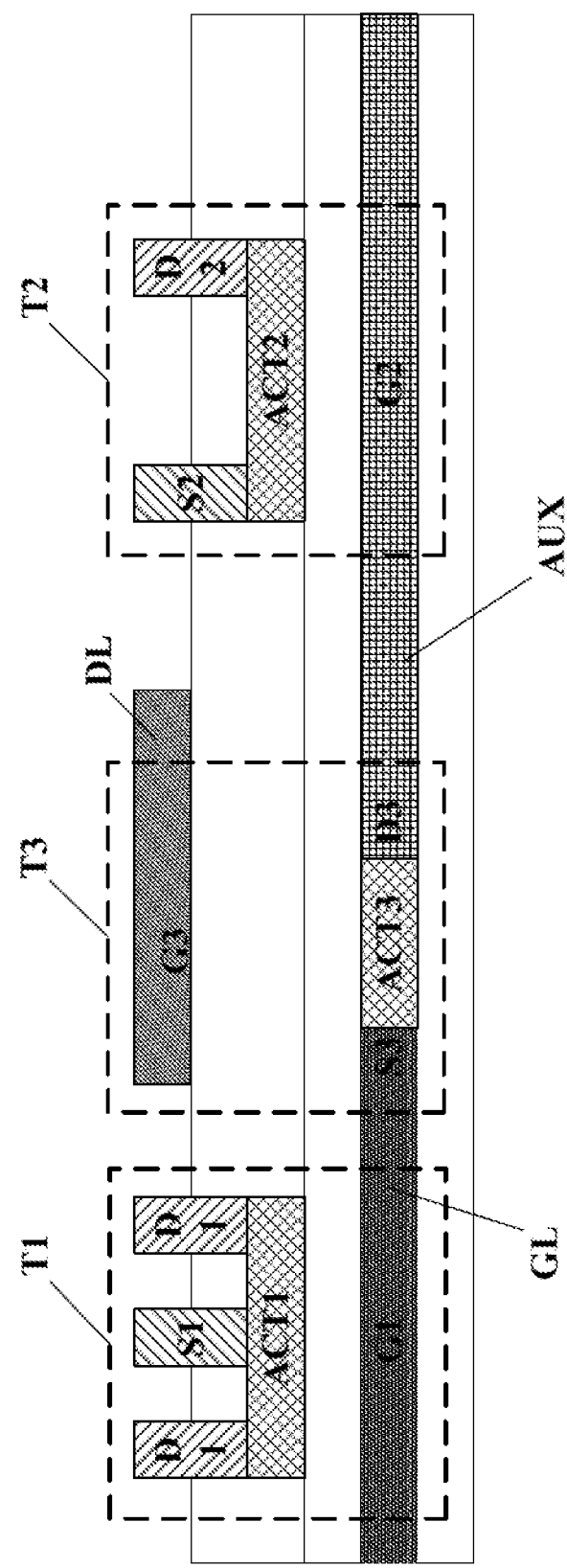
FIG. 5 is a cross-sectional view along a A-A' line in FIG. 4.

In some embodiments, in each of the plurality of subpixel areas Spa, the array substrate includes a first thin film transistor T1, a second thin film transistor T2, and a third thin film transistor T3. FIG. 3 is a schematic diagram illustrating the structure of an array substrate in some embodiments according to the present disclosure. FIG. 4 is a zoom-in view of the array substrate in FIG. 3. FIG. 5 is a cross-sectional view along a A-A' line in FIG. 4. Referring to FIGS. 2 to 5, the first thin film transistor T1 includes a first active layer ACT1, a first gate electrode G1 connected to one of the plurality of gate lines GL, a first source electrode S1 connected to one of the plurality of data lines DL, and a first drain electrode D1 connected to the pixel electrode PIX; the second thin film transistor T2 includes a second active layer ACT2, a second gate electrode G2, a second source electrode S2 connected to the one of the plurality of data lines DL, and a second drain electrode D2 connected to the pixel electrode PIX; and the third thin film transistor T3 includes a third active layer ACT3, a third gate electrode G3 connected to the one of the plurality of data lines DL, a third source electrode S3 connected to the one of the plurality of gate lines GL, and a third drain electrode D3 connected to the second gate electrode G2 and one of the plurality of auxiliary signal lines AUX.

Referring to FIG. 4 and FIG. 5, in some embodiments, a portion of the one of the plurality of auxiliary signal lines AUX constitutes the second gate electrode G2, e.g., the second gate electrode G2 is an integral part of the one of the plurality of auxiliary signal lines AUX. When permitted, a common voltage of the one of the plurality of auxiliary signal lines AUX is the gate voltage configured to turn on the second thin film transistor T2.

In some embodiments, the second source electrode S2 is connected to one of the plurality of data lines DL. Optionally, the second source electrode S2 is in a same layer as the one of the plurality of data lines DL, e.g., made in a same patterning process using a same mask plate and a same material. As used herein, the term "same layer" refers to the relationship between the layers simultaneously formed in the same step. In one example, the second source electrode S2 and the plurality of data lines DL are in a same layer when they are formed as a result of one or more steps of a same patterning process performed in a same layer of material. In another example, the second source electrode S2 and the plurality of data lines DL can be formed in a same layer by simultaneously performing the step of forming the second source electrode S2 and the step of forming the plurality of data lines DL. The term "same layer" does not always mean that the thickness of the layer or the height of the layer in a cross-sectional view is the same.

Referring to FIG. 4 and FIG. 5, in some embodiments, a portion of the one of the plurality of data lines DL constitutes the third gate electrode G3, e.g., the third gate electrode G3 is an integral part of the one of the plurality of data lines DL. When permitted, the data voltage of the one of the plurality of data lines DL is the gate voltage configured to turn on the third thin film transistor T3.

Referring to FIG. 4 and FIG. 5, in some embodiments, a portion of the one of the plurality of auxiliary signal lines AUX constitutes the third drain electrode D3. e.g., the third drain electrode D3 is an integral part of the one of the plurality of auxiliary signal lines AUX. Because the one of the plurality of auxiliary signal lines AUX is connected to the second gate electrode G2 (e.g., the second gate electrode G2 is an integral part of the one of the plurality of auxiliary signal lines AUX), when the third thin film transistor T3 is turned on, a voltage at the third drain electrode D3 is used as the gate voltage configured to turn on the second thin film transistor T2.

Referring to FIG. 4 and FIG. 5, in some embodiments, a portion of the one of the plurality of gate lines GL constitutes the third source electrode S3, e.g., the third source electrode S3 is an integral part of the one of the plurality of gate lines GL. In some embodiments, the third thin film transistor T3 is configured such that a source-drain current is restricted when a data voltage is applied to the third gate electrode G3, for example, the third thin film transistor T3 is not fully turned on, and the channel region of the third active layer ACT3 is not fully conductive. In one example, when the data voltage is applied to the third gate electrode G3, a restricted current from the third source electrode S3 (having a gate scanning voltage for driving image display) to the third drain electrode D3 (connected to the one of the plurality of auxiliary signal lines AUX) will slightly increase the voltage level at the third drain electrode D3. The third drain electrode D3 is connected to the one of the plurality of auxiliary signal lines AUX, which is in turn connected to the second gate electrode G2. Thus, when permitted, the slightly increased voltage level at the third drain electrode D3 is at a level sufficient for turning on the second thin film transistor T2. The operation method of the pixel driving circuit will be discussed below in connection with the driving method.

In some embodiments, and as shown in FIG. 4 and FIG. 5, a portion of the one of the plurality of auxiliary signal lines AUX constitutes the second gate electrode G2, a portion of the one of the plurality of data lines DL constitutes the third gate electrode G3, a portion of the one of the plurality of auxiliary signal lines AUX constitutes the third drain electrode D3, and a portion of the one of the plurality of gate lines GL constitutes the third source electrode S3.

Optionally, the first active layer ACT1, the second active layer ACT2, and the third active layer ACT3 are in a same layer.

Optionally, at least two of the first active layer ACT1, the second active layer ACT2, and the third active layer ACT3 are not in a same layer.

In some embodiments, one or more of the first active layer ACT1, the second active layer ACT2, and the third active layer ACT3 include a doped semiconductor material, e.g., an $N^+$ doped semiconductor material. Optionally, the third active layer ACT3 is less doped than the first active layer ACT1 and the second active layer ACT2. For example, the third active layer ACT3 is lightly doped, and the first active layer ACT1 and the second active layer ACT2 are heavily doped. Optionally, each of the first active layer ACT1, the second active layer ACT2, and the third active layer ACT3 includes a doped semiconductor material, e.g., an $N^+$ doped semiconductor material. By having the third active layer ACT3 lightly doped, a restricted source drain current in the third thin film transistor T3 can be achieved, e.g., the third thin film transistor T3 is made such that the third thin film transistor T3 is not fully turned on when the data signal is applied to the third gate electrode G3. Optionally, when the data voltage is applied to the third gate electrode G3, the voltage level at the third drain electrode D3 is slightly increased by a leak current from the third source electrode S3 (having a gate scanning voltage for driving image display) to the third drain electrode D3 (connected to the one of the plurality of auxiliary signal lines AUX).

In some embodiments, the first active layer includes a first semiconductor sub-layer, a first doped semiconductor sub-layer on the first semiconductor sub-layer, a second semiconductor sub-layer on a side of the first doped semiconductor sub-layer distal to the first semiconductor sub-layer, and a second doped semiconductor sub-layer on a side of the second semiconductor sub-layer distal to the first doped semiconductor sub-layer. Optionally, the third active layer includes a third semiconductor sub-layer and a third doped semiconductor sub-layer on the third semiconductor sub-layer. Optionally, the first semiconductor sub-layer and the third semiconductor sub-layer are in a same layer. Optionally, the first doped semiconductor sub-layer and the third doped semiconductor sub-layer are in a same layer. Optionally, the first doped semiconductor sub-layer and the third doped semiconductor sub-layer are less doped than the second doped semiconductor sub-layer. For example, the first doped semiconductor sub-layer and the third doped semiconductor sub-layer are lightly doped, and the second doped semiconductor sub-layer is heavily doped. Optionally, the first active layer further includes a first insulating sub-layer between the first doped semiconductor sub-layer and the second semiconductor sub-layer. Optionally, the second doped semiconductor sub-layer is partially removed, e.g., the second doped semiconductor sub-layer is absent in the channel region of the first thin film transistor.

In some embodiments, the second active layer includes a fourth semiconductor sub-layer, a fourth doped semiconductor sub-layer on the fourth semiconductor sub-layer, a fifth semiconductor sub-layer on a side of the fourth doped semiconductor sub-layer distal to the fourth semiconductor sub-layer, and a fifth doped semiconductor sub-layer on a side of the fifth semiconductor sub-layer distal to the fourth doped semiconductor sub-layer. Optionally, the first semiconductor sub-layer and the fourth semiconductor sub-layer are in a same layer. Optionally, the first doped semiconductor sub-layer and the fourth doped semiconductor sub-layer are in a same layer, the second semiconductor sub-layer and the fifth semiconductor sub-layer are in a same layer, and the second doped semiconductor sub-layer and the fifth doped semiconductor sub-layer are in a same layer. Optionally, the fourth doped semiconductor sub-layer and the third doped semiconductor sub-layer are less doped than the fifth doped semiconductor sub-layer. For example, the fourth doped semiconductor sub-layer and the third doped semiconductor sub-layer are lightly doped, and the fifth doped semiconductor sub-layer is heavily doped. Optionally, the first active layer further includes a first insulating sub-layer between the first doped semiconductor sub-layer and the second semiconductor sub-layer, and the second active layer further includes a second insulating sub-layer between the fourth doped semiconductor sub-layer and the fifth semiconductor sub-layer. Optionally, the first insulating sub-layer and the second insulating sub-layer are in a same layer and comprise a same material. Optionally, the fifth doped semiconductor sub-layer is partially removed, e.g., the fifth doped semiconductor sub-layer is absent in the channel region of the second thin film transistor.

FIG. 6 is a schematic diagram illustrating the structure of a first active layer, a second active layer, and a third active layer in some embodiments according to the present disclosure. Referring to FIG. 6, in some embodiments, the first active layer ACT1 includes a first amorphous silicon sub-layer AS1, a first doped amorphous silicon sub-layer DAS1 on the first amorphous silicon sub-layer AS1, a second amorphous silicon sub-layer AS2 on a side of the first doped amorphous silicon sub-layer DAS1 distal to the first amorphous silicon sub-layer AS1, and a second doped amorphous silicon sub-layer DAS2 on a side of the second amorphous silicon sub-layer AS2 distal to the first doped amorphous silicon sub-layer DAS1. Optionally, the third active layer ACT3 includes a third amorphous silicon sub-layer AS3 and a third doped amorphous silicon sub-layer DAS3 on the third amorphous silicon sub-layer AS3. By having only one doped semiconductor sub-layer, a restricted source drain current can be achieved in the third thin film transistor T3. In some embodiments, the first active layer ACT1 further includes a first insulating sub-layer IN1 between the first doped amorphous silicon sub-layer DAS1 and the second amorphous silicon sub-layer AS2. Optionally, the second doped amorphous silicon sub-layer DAS2 is partially removed, e.g., the second doped amorphous silicon sub-layer DAS2 is absent in the channel region of the first thin film transistor T1.

In some embodiments, the first amorphous silicon sub-layer AS1 and the third amorphous silicon sub-layer AS3 are in a same layer. Optionally, the first doped amorphous silicon sub-layer DAS1 and the third doped amorphous silicon sub-layer DAS3 are in a same layer. Optionally, the first doped amorphous silicon sub-layer DAS1 and the third doped amorphous silicon sub-layer DAS3 are less doped than the second doped amorphous silicon sub-layer DAS2. For example, the first doped amorphous silicon sub-layer DAS1 and the third doped amorphous silicon sub-layer DAS3 are lightly doped, and the second doped amorphous silicon sub-layer DAS2 is heavily doped. By having the third doped amorphous silicon sub-layer DAS3 lightly doped, a restricted source drain current can be achieved in the third thin film transistor T3.

Referring to FIG. 6, in some embodiments, the second active layer ACT2 includes a fourth amorphous silicon sub-layer AS4, a fourth doped amorphous silicon sub-layer DAS4 on the fourth amorphous silicon sub-layer AS4, a fifth amorphous silicon sub-layer AS5 on a side of the fourth doped amorphous silicon sub-layer DAS4 distal to the fourth amorphous silicon sub-layer AS4, and a fifth doped amorphous silicon sub-layer DAS5 on a side of the fifth amorphous silicon sub-layer AS5 distal to the fourth doped amorphous silicon sub-layer DAS4. Optionally, the fifth doped amorphous silicon sub-layer DAS5 is partially removed, e.g., the fifth doped amorphous silicon sub-layer DAS5 is absent in the channel region of the second thin film transistor T2.

In some embodiments, the first amorphous silicon sub-layer AS1 and the fourth amorphous silicon sub-layer AS4 are in a same layer. Optionally, the first doped amorphous silicon sub-layer DAS1 and the fourth doped amorphous silicon sub-layer DAS4 are in a same layer. Optionally, the second amorphous silicon sub-layer AS2 and the fifth amorphous silicon sub-layer AS5 are in a same layer. Optionally, the second doped amorphous silicon sub-layer DAS2 and the fifth doped amorphous silicon sub-layer DAS5 are in a same layer.

In some embodiments, the first amorphous silicon sub-layer AS1, the third amorphous silicon sub-layer AS3, and the fourth amorphous silicon sub-layer AS4 are in a same layer; the first doped amorphous silicon sub-layer DAS1, the third doped amorphous silicon sub-layer DAS3, and the fourth doped amorphous silicon sub-layer DAS4 are in a same layer; the second amorphous silicon sub-layer AS2 and the fifth amorphous silicon sub-layer AS5 are in a same layer; and the second doped amorphous silicon sub-layer DAS2 and the fifth doped amorphous silicon sub-layer DAS5 are in a same layer.

In some embodiments, the fourth doped amorphous silicon sub-layer DAS4 and the third doped amorphous silicon sub-layer DAS3 are less doped than the fifth doped amorphous silicon sub-layer DAS5. For example, the fourth doped amorphous silicon sub-layer DAS4 and the third doped amorphous silicon sub-layer DAS3 are lightly doped, and the fifth doped amorphous silicon sub-layer DAS5 is heavily doped. Optionally, the first doped amorphous silicon sub-layer DAS1, the third doped amorphous silicon sub-layer DAS3, and the fourth doped amorphous silicon sub-layer DAS4 are less doped than each of the second doped amorphous silicon sub-layer DAS2 and the fifth doped amorphous silicon sub-layer DAS5. For example, the first doped amorphous silicon sub-layer DAS1, the third doped amorphous silicon sub-layer DAS3, and the fourth doped amorphous silicon sub-layer DAS4 are lightly doped, and the second doped amorphous silicon sub-layer DAS2 and the fifth doped amorphous silicon sub-layer DAS5 are heavily doped.

In some embodiments, the first active layer ACT1 further includes a first insulating sub-layer IN1 between the fast doped amorphous silicon sub-layer DAS1 and the second amorphous silicon sub-layer AS2, and the second active layer ACT2 further includes a second insulating sub-layer IN2 between the fourth doped amorphous silicon sub-layer DAS4 and the fifth amorphous silicon sub-layer AS5. Optionally, the first insulating sub-layer IN1 and the second insulating sub-layer IN2 are in a same layer, e.g., made in a same patterning process using a same mask plate and a same material.

The array substrate may be any appropriate type of array substrate. In some embodiments, the array substrate is a liquid crystal array substrate. In some embodiments, the array substrate has a display mode selected from the group consisting of an in-plane switching mode, a Twisted Nematic mode, an Advanced Super Dimension Switch mode, and a High Aperture Ratio Advanced Super Dimension Switch mode.

Optionally, the array substrate includes a common electrode. Optionally, the plurality of auxiliary signal lines AUX are a plurality of common electrode signal lines, and the common electrode is connected to one of the plurality of auxiliary signal lines AUX.

Optionally, the common electrode is not disposed in the array substrate. For example, the common electrode is disposed in a counter substrate facing the array substrate. The array substrate and the counter substrate are assembled together to form a display apparatus. Optionally, the plurality of auxiliary signal lines AUX in the array substrate are a plurality of common electrode signal lines, and the common electrode in the counter substrate is connected to one of the plurality of auxiliary signal lines AUX.

Figure 7:
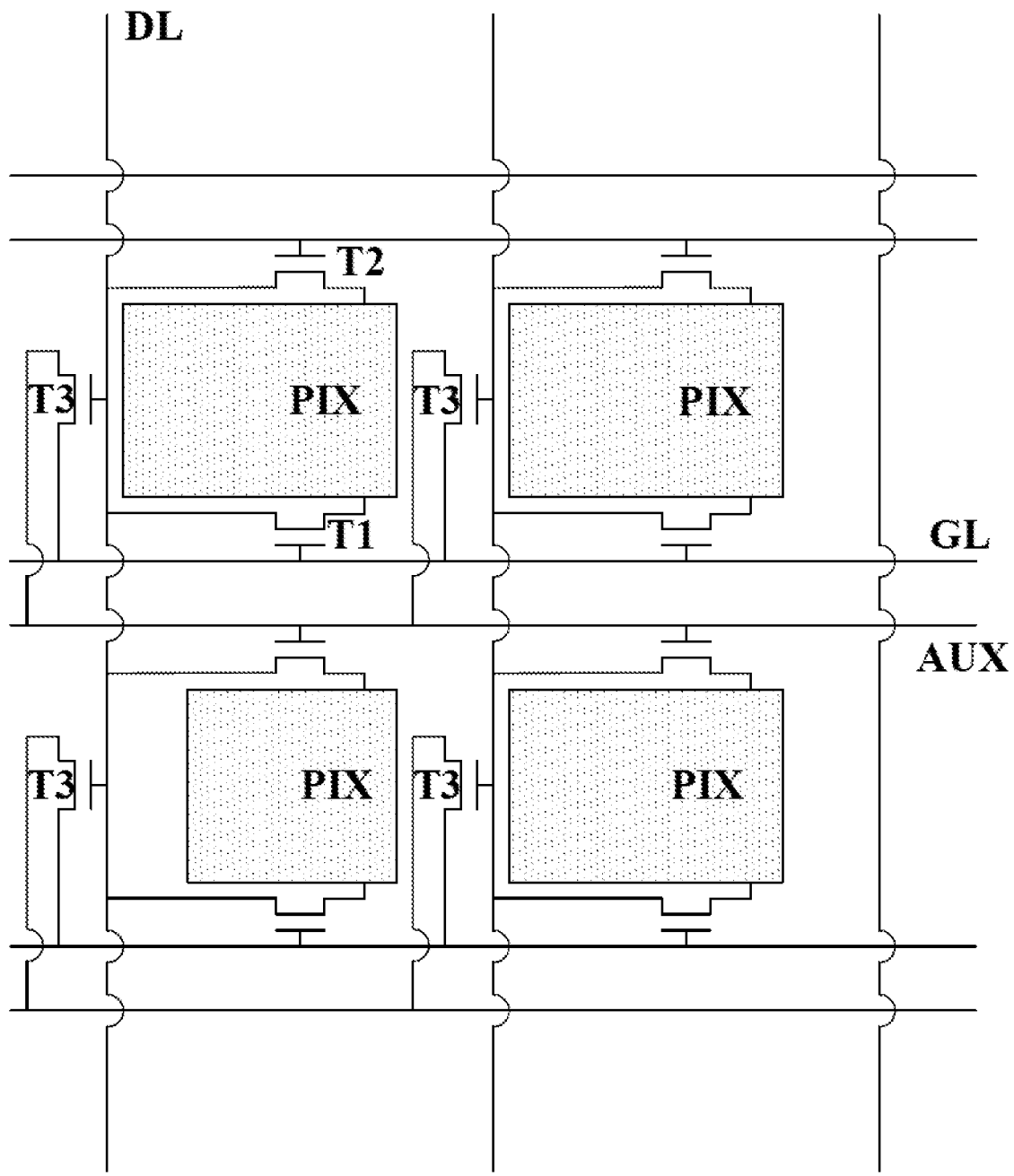
FIG. 7 is a schematic diagram illustrating the structure of an array substrate in some embodiments according to the present disclosure.

Various alternative implementations of the present disclosure may be practiced. Referring to FIG. 2, in each of the plurality of subpixel areas Spa, the one of the plurality of auxiliary signal lines AUX (connected to the third drain electrode of the third thin film transistor T3 and the second gate electrode of the second thin film transistor T2) and the one of the plurality of gate lines GL (connected to the first gate electrode of the first thin film transistor T1 and the third source electrode of the third thin film transistor T3) are spaced apart by the pixel electrode PIX of the same subpixel area. FIG. 7 is a schematic diagram illustrating the structure of an array substrate in some embodiments according to the present disclosure. Referring to FIG. 7, the one of the plurality of auxiliary signal lines AUX (connected to the third drain electrode of the third thin film transistor T3 and the second gate electrode of the second thin film transistor T2) and the one of the plurality of gate lines GL (connected to the first gate electrode of the first thin film transistor T1 and the third source electrode of the third thin film transistor T3) are not spaced apart by the pixel electrode PIX. Rather, in FIG. 7, the one of the plurality of auxiliary signal lines AUX (connected to the third drain electrode of the third thin film transistor T3 and the second gate electrode of the second thin film transistor T2) and the one of the plurality of gate lines GL (connected to the first gate electrode of the first thin film transistor T1 and the third source electrode of the third thin film transistor T3) are directly adjacent to each other, and are disposed in a same inter-subpixel region between two directly adjacent subpixel areas of the plurality of subpixel areas Spa.

In another aspect, the present disclosure provides a display apparatus having the array substrate described herein. In some embodiments, the display apparatus includes a counter substrate facing the array substrate. The display apparatus may be any appropriate types of display apparatus. In some embodiments, the display apparatus is a liquid crystal display apparatus. In some embodiments, the display apparatus has a display mode selected from the group consisting of an in-plane switching mode, a Twisted Nematic mode, an Advanced Super Dimension Switch mode, and a High Aperture Ratio Advanced Super Dimension Switch mode. Optionally, the display apparatus is an in-plane switching type liquid crystal display apparatus.

In some embodiments, the display apparatus is an organic light emitting diode display apparatus. For example, the pixel electrode and the common electrode in the organic light emitting diode display apparatus are a cathode and an anode for driving light emission in an organic light emitting diode.

Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating an array substrate having a plurality of subpixel areas. In some embodiments, the method includes forming a plurality of gate lines configured to provide a plurality of gate scanning signals respectively to the plurality of subpixel areas; forming a plurality of data lines configured to provide a plurality of data signals respectively to the plurality of subpixel areas; forming a plurality of auxiliary signal lines; and forming a pixel electrode. Optionally, the array substrate is formed to include, in each of the plurality of subpixel areas, a first thin film transistor having a first gate electrode connected to one of the plurality of gate lines, a first source electrode connected to one of the plurality of data lines, and a first drain electrode connected to the pixel electrode; a second thin film transistor having a second gate electrode, a second source electrode connected to the one of the plurality of data lines, and a second drain electrode connected to the pixel electrode; and a third thin film transistor having a third gate electrode connected to the one of the plurality of data lines, a third source electrode connected to the one of the plurality of gate lines, and a third drain electrode connected to the second gate electrode and one of the plurality of auxiliary signal lines. Optionally, the plurality of auxiliary signal lines are configured to be provided with a voltage having a voltage level lower than a voltage level of a gate scanning signal provided to the gate line.

In some embodiments, the second gate electrode is formed as an integral portion of the one of the plurality of auxiliary signal lines. Optionally, the third gate electrode is formed as an integral portion of the one of the plurality of data lines. Optionally, the third drain electrode is formed as an integral portion of the one of the plurality of auxiliary signal lines. Optionally, the third source electrode is formed as an integral portion of the one of the plurality of gate lines. In one example, the second gate electrode is formed as an integral portion of the one of the plurality of auxiliary signal lines, the third gate electrode is formed as an integral portion of the one of the plurality of data lines, the third drain electrode is formed as an integral portion of the one of the plurality of auxiliary signal lines, and the third source electrode is formed as an integral portion of the one of the plurality of gate lines.

In some embodiments, forming the first thin film transistor further includes forming a first active layer, forming the second thin film transistor further includes forming a second active layer, and forming the third thin film transistor further includes forming a third active layer. Optionally, the first active layer, the second active layer, and the third active layer are formed in a same layer, e.g., in a same patterning process using a same mask plate and a same material. Optionally, at least two of the first active layer, the second active layer, and the third active layer are not formed in a same layer.

In some embodiments, one or more of the first active layer, the second active layer, and the third active layer are formed to include a doped semiconductor material, e.g., an $N^+$ doped semiconductor material. Optionally, the third active layer is formed to be less doped than the first active layer and the second active layer. For example, the third active layer is formed to be lightly doped, and the first active layer and the second active layer are heavily doped.

In some embodiments, forming the first active layer includes forming a first semiconductor sub-layer, forming a first doped semiconductor sub-layer on the first semiconductor sub-layer, forming a second semiconductor sub-layer on a side of the first doped semiconductor sub-layer distal to the first semiconductor sub-layer, and forming a second doped semiconductor sub-layer on a side of the second semiconductor sub-layer distal to the first doped semiconductor sub-layer. Optionally, forming the third active layer includes forming a third semiconductor sub-layer and forming a third doped semiconductor sub-layer on the third semiconductor sub-layer. Optionally, the first semiconductor sub-layer and the third semiconductor sub-layer are formed in a same layer, e.g., in a same patterning step using a same mask plate and a same material. Optionally, the first doped semiconductor sub-layer and the third doped semiconductor sub-layer are formed in a same layer, e.g., in a same patterning step using a same mask plate and a same material.

In some embodiments, forming the first semiconductor sub-layer and the first doped semiconductor sub-layer includes forming a first semiconductor material layer, and doping the first semiconductor material layer thereby forming the first semiconductor sub-layer and the first doped semiconductor sub-layer on the first semiconductor sub-layer. In some embodiments, forming the second semiconductor sub-layer and the second doped semiconductor sub-layer includes forming a second semiconductor material layer, and doping the second semiconductor material layer thereby forming the second semiconductor sub-layer and the second doped semiconductor sub-layer on the second semiconductor sub-layer. In some embodiments, forming the third semiconductor sub-layer and the third doped semiconductor sub-layer includes forming a third semiconductor material layer, and doping the third semiconductor material layer thereby forming the third semiconductor sub-layer and the third doped semiconductor sub-layer on the third semiconductor sub-layer. Optionally, the step of doping is performed using a phosphor-containing material (e.g., using a $PH_3/H_2$ plasma). In some embodiments, the first doped semiconductor sub-layer and the third doped semiconductor sub-layer are formed to be less doped than the second doped semiconductor sub-layer. Optionally, forming the first active layer further includes forming a first insulating sub-layer between the first doped semiconductor sub-layer and the second semiconductor sub-layer.

In some embodiments, forming the second active layer includes forming a fourth semiconductor sub-layer, forming a fourth doped semiconductor sub-layer on the fourth semiconductor sub-layer, forming a fifth semiconductor sub-layer on a side of the fourth doped semiconductor sub-layer distal to the fourth semiconductor sub-layer, and forming a fifth doped semiconductor sub-layer on a side of the fifth semiconductor sub-layer distal to the fourth doped semiconductor sub-layer. Optionally, the first semiconductor sub-layer and the fourth semiconductor sub-layer are formed in a same layer, e.g., in a same patterning step using a same mask plate and a same material. Optionally, the first doped semiconductor sub-layer and the fourth doped semiconductor sub-layer are formed in a same layer, e.g., in a same patterning step using a same mask plate and a same material. Optionally, the second semiconductor sub-layer and the fifth semiconductor sub-layer are formed in a same layer, e.g., in a same patterning step using a same mask plate and a same material. Optionally, the second doped semiconductor sub-layer and the fifth doped semiconductor sub-layer are formed in a same layer. e.g., in a same patterning step using a same mask plate and a same material.

Optionally, the first semiconductor sub-layer, the third semiconductor sub-layer, and the fourth semiconductor sub-layer are formed in a same layer, e.g., in a same patterning step using a same mask plate and a same material. Optionally, the first doped semiconductor sub-layer, the third doped semiconductor sub-layer, and the fourth doped semiconductor sub-layer are formed in a same layer, e.g., in a same patterning step using a same mask plate and a same material.

In some embodiments, forming the fourth semiconductor sub-layer and the fourth doped semiconductor sub-layer includes forming a fourth semiconductor material layer, and doping the fourth semiconductor material layer thereby forming the fourth semiconductor sub-layer and the fourth doped semiconductor sub-layer on the first semiconductor sub-layer. In some embodiments, forming the fifth semiconductor sub-layer and the fifth doped semiconductor sub-layer includes forming a fifth semiconductor material layer, and doping the fifth semiconductor material layer thereby forming the fifth semiconductor sub-layer and the fifth doped semiconductor sub-layer on the fifth semiconductor sub-layer. Optionally, the fourth semiconductor material layer and the first semiconductor material layer are formed in a same layer, e.g., in a same patterning step using a same mask plate and a same material. Optionally, the fifth semiconductor material layer and the second semiconductor material layer are formed in a same layer, e.g., in a same patterning step using a same mask plate and a same material.

Optionally, the step of doping is performed using a phosphor-containing material (e.g., using a $PH_3/H_2$ plasma). Optionally, the fourth doped semiconductor sub-layer and the third doped semiconductor sub-layer are formed to be less doped than the fifth doped semiconductor sub-layer. Optionally, the first doped semiconductor sub-layer, the third doped semiconductor sub-layer, and the fourth doped semiconductor sub-layer are formed to be less doped than each of the second doped semiconductor sub-layer and the fifth doped semiconductor sub-layer.

Optionally, forming the first active layer further includes forming a first insulating sub-layer between the first doped semiconductor sub-layer and the second semiconductor sub-layer, and forming the second active layer further includes forming a second insulating sub-layer between the fourth doped semiconductor sub-layer and the fifth semiconductor sub-layer. Optionally, the first insulating sub-layer and the second insulating sub-layer are formed in a same layer. e.g., in a same patterning step using a same mask plate and a same material.

In some embodiments, the method further includes forming a common electrode. Optionally, the plurality of auxiliary signal lines are a plurality of common electrode signal lines, and the common electrode is formed to be connected to one of the plurality of auxiliary signal lines.

Figure 8A:
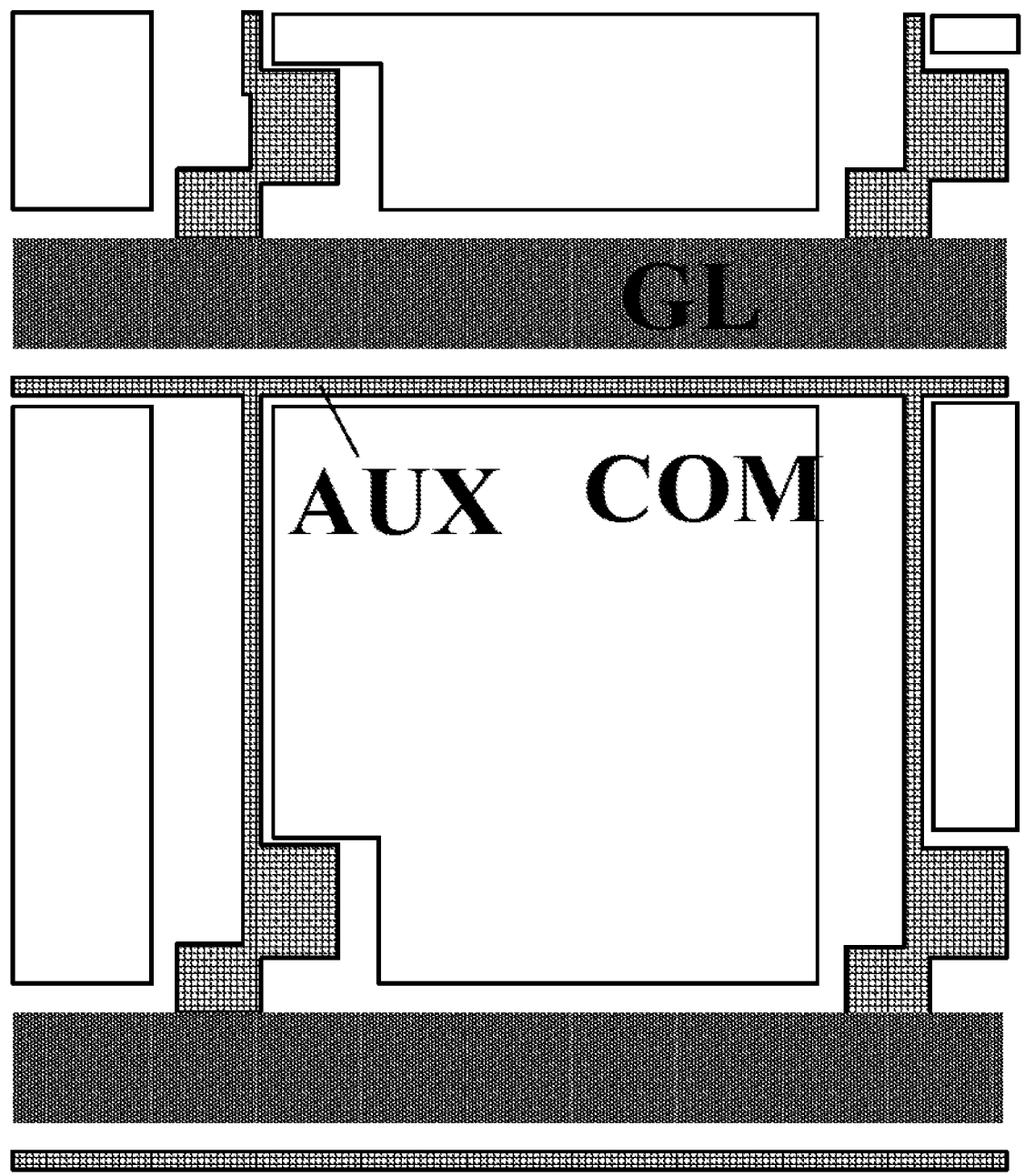
FIGS. 8A to 8D illustrate a process of fabricating an array substrate in some embodiments according to the present disclosure.

FIGS. 8A to 8D illustrate a process of fabricating an array substrate in some embodiments according to the present disclosure. Referring to FIG. 8A, a common electrode COM is first formed. Subsequently, a plurality of gate lines GL and a plurality of auxiliary signal lines AUX are formed. The plurality of auxiliary signal lines AUX optionally are a plurality of common electrode signal lines for providing a common voltage signal to the common electrode COM. Optionally, at least a portion of each of the plurality of auxiliary signal lines AUX is formed to extend along a direction substantially parallel to a direction of the plurality of gate lines GL. Subsequently, a gate insulating layer (substantially transparent) is formed on the array substrate.

Figure 8B:
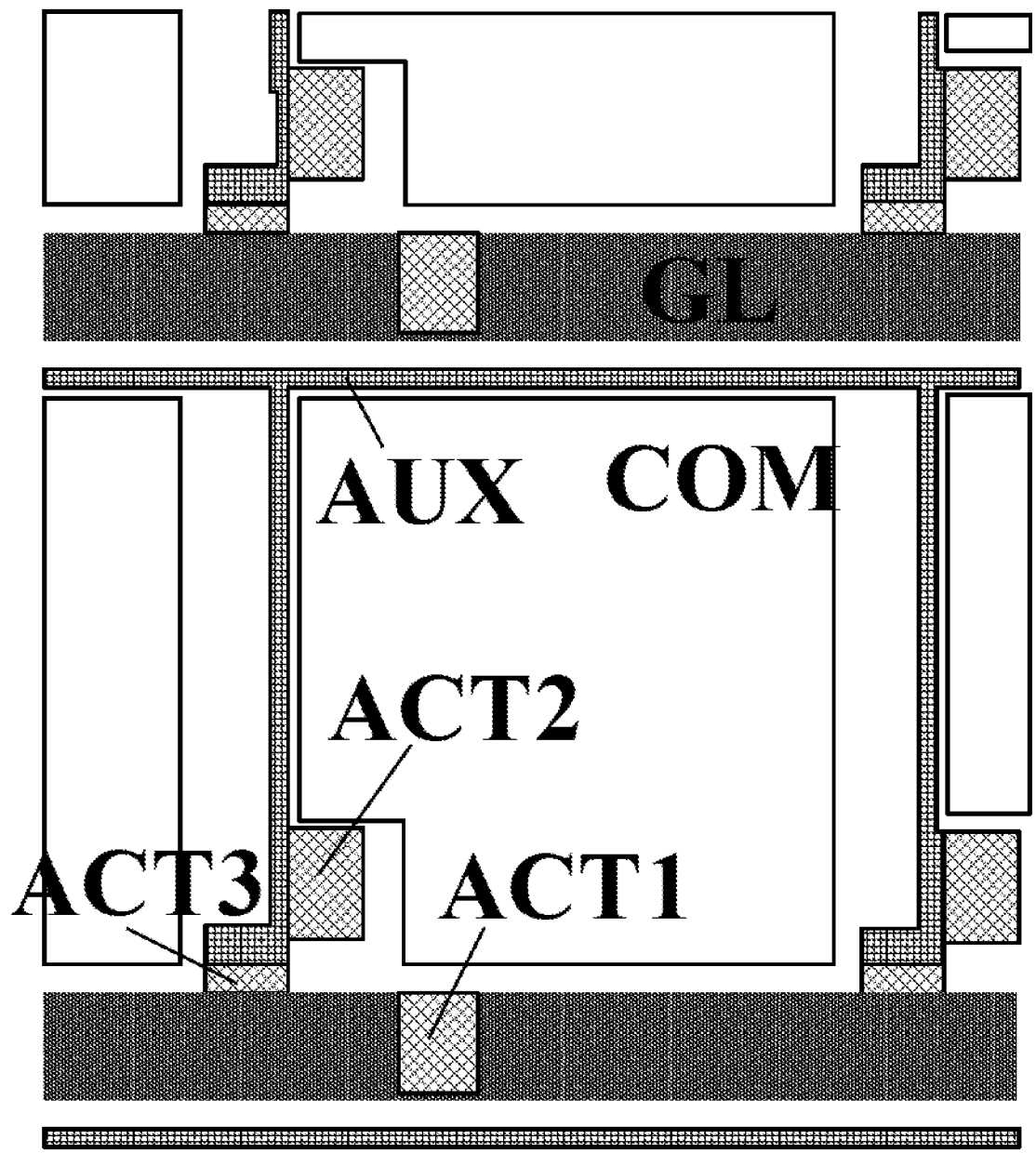

Referring to FIG. 8B, a semiconductor material layer is then formed on the array substrate, and is patterned to form a first active layer ACT1, a second active layer ACT2, and a third active layer ACT3. As discussed above in connection with FIG. 6, each of the first active layer ACT1, the second active layer ACT2, and the third active layer ACT3 may be formed to include a plurality of sub-layers and optionally insulating layers. Optionally, a half-tone mask plate or a gray-tone mask plate is used for patterning the first active layer ACT1, the second active layer ACT2, and the third active layer ACT3. For example, the half-tone mask plate or the gray-tone mask plate may be used in the patterning process so that the third active layer ACT3 includes a third semiconductor sub-layer, a third doped semiconductor sub-layer, and optionally an insulating sub-layer on a side of the third doped semiconductor sub-layer distal to the third semiconductor sub-layer, whereas the first active layer ACT1 and the second active layer ACT2 includes two additional semiconductor sub-layers (one doped and the other un-doped). For example, as discussed above, the first active layer ACT1 is formed to further include a second semiconductor sub-layer and a second doped semiconductor sub-layer, and the second active layer ACT2 is formed to further include a fifth semiconductor sub-layer and a fifth doped semiconductor sub-layer. Optionally, a portion of the second doped semiconductor sub-layer corresponding to a channel region of the first active layer ACT1 is removed. Optionally, a portion of the fifth doped semiconductor sub-layer corresponding to a channel region of the second active layer ACT2 is removed. Subsequently, an insulating layer (substantially transparent) is formed on the array substrate.

Figure 8C:
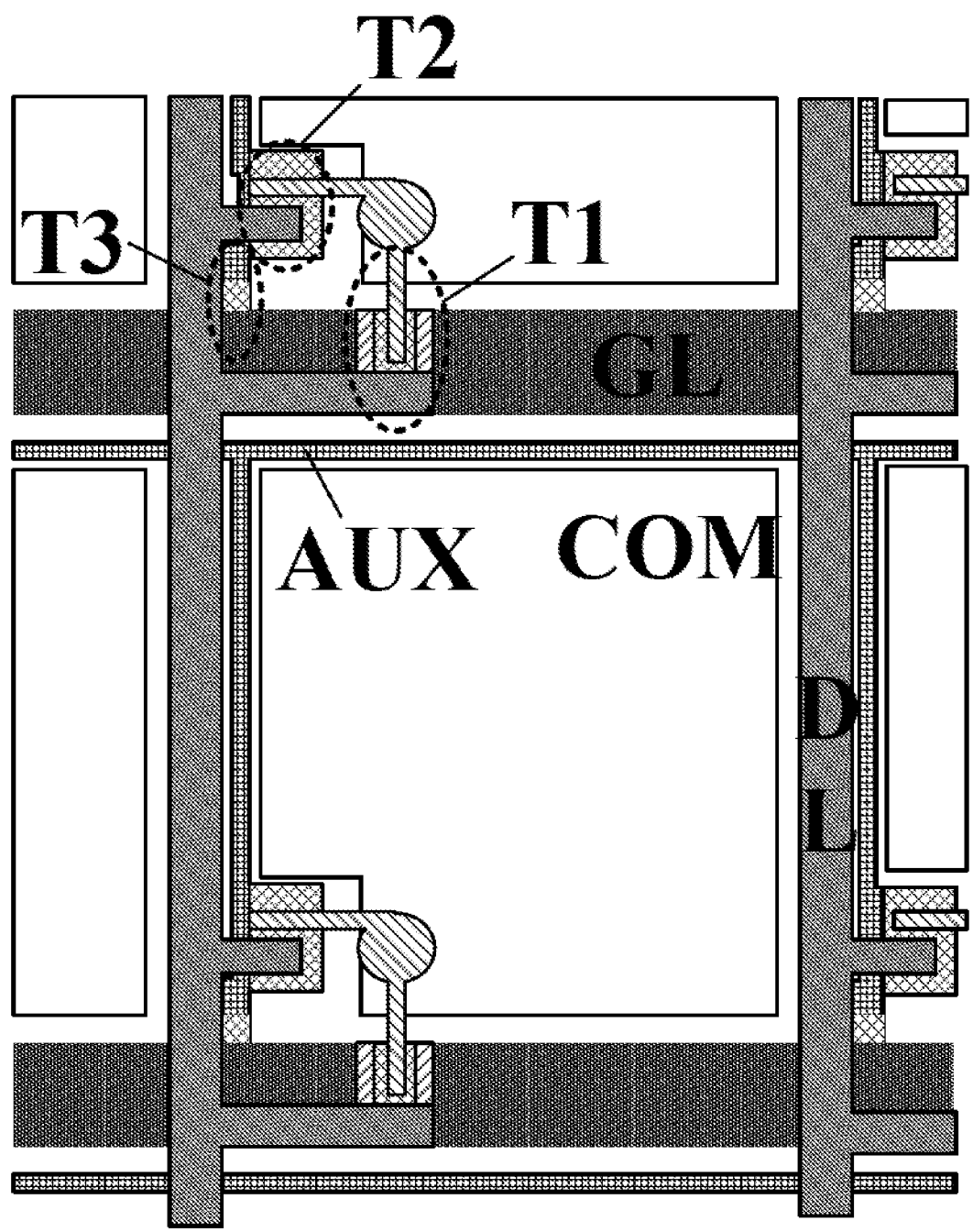

Referring to FIG. 8C, a conductive material layer is then formed on the array substrate, and is patterned to form a plurality of data lines as well as drain electrodes and source electrodes for the thin film transistors, thereby also forming the first thin film transistor T1, the second thin film transistor T2, and the third thin film transistor T3. Subsequently, a passivation layer (substantially transparent) is formed on the array substrate, and a plurality of vias are formed to extend through the passivation layer.

Figure 8D:
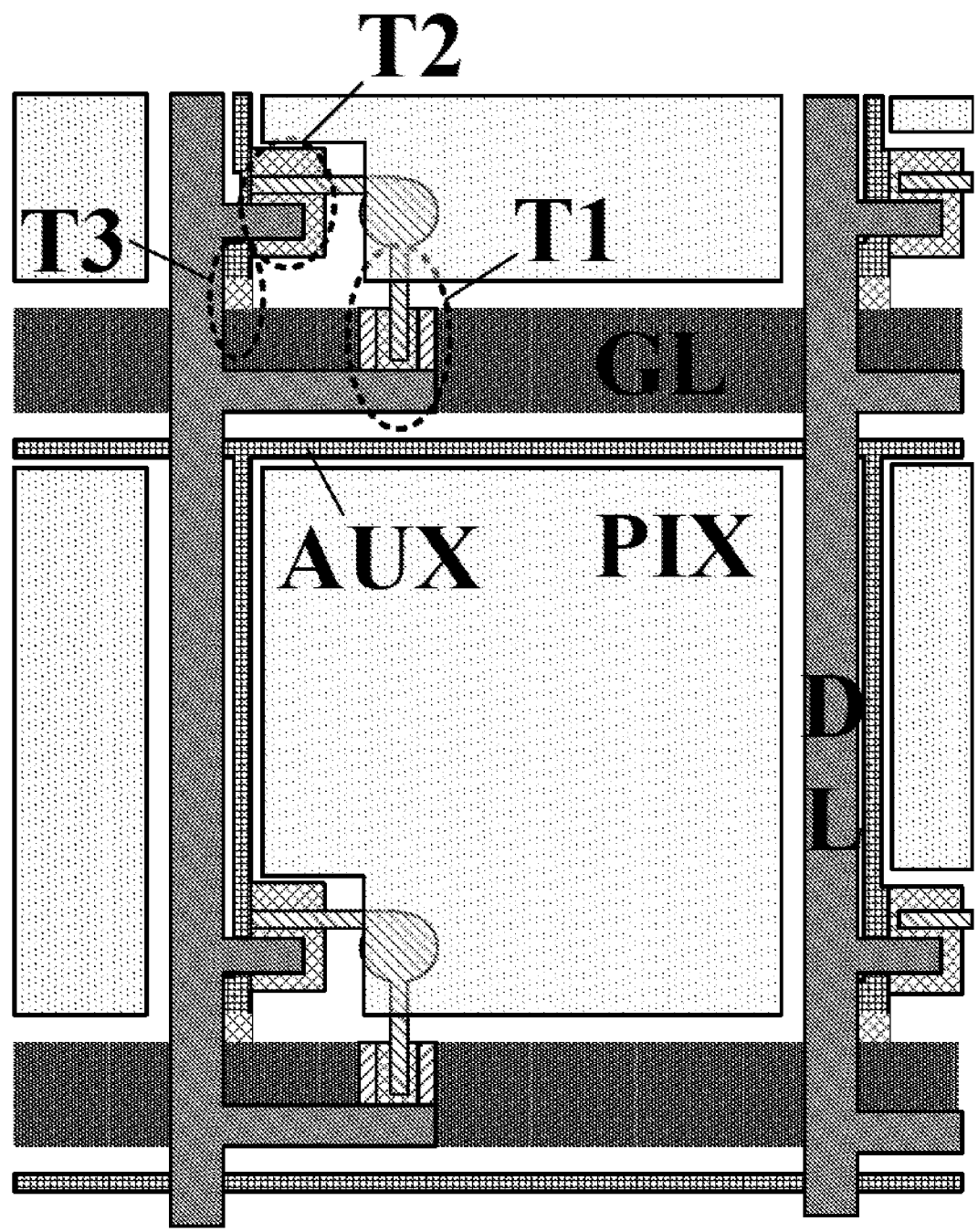

Referring to FIG. 8D, a pixel electrode PIX is then form on the passivation layer. The pixel electrode PIX is formed to be connected to drain electrodes of the first thin film transistor T1 and the second thin film transistor T2.

In another aspect, the present disclosure provides a method for driving image display in a display apparatus having a plurality of subpixels. The display apparatus comprises a plurality of gate lines configured to provide a plurality of gate scanning signals respectively to the plurality of subpixels; a plurality of data lines configured to provide a plurality of data signals respectively to the plurality of subpixels; a plurality of auxiliary signal lines; and a pixel electrode; wherein the display apparatus in each of the plurality of subpixels comprises a first thin film transistor having a first gate electrode connected to one of the plurality of gate lines, a first source electrode connected to one of the plurality of data lines, and a first drain electrode connected to the pixel electrode; a second thin film transistor having a second gate electrode, a second source electrode connected to the one of the plurality of data lines, and a second drain electrode connected to the pixel electrode; and a third thin film transistor having a third gate electrode connected to the one of the plurality of data lines, a third source electrode connected to the one of the plurality of gate lines, and a third drain electrode connected to the second gate electrode and one of the plurality of auxiliary signal lines. In some embodiments, the method includes providing a gate scanning signal through the one of the plurality of gate lines to the first gate electrode and the third source electrode; providing a data signal through the one of the plurality of data lines to the first source electrode, the second source electrode, and the third gate electrode; and providing a common voltage signal through one of the plurality of auxiliary signal lines to the third drain electrode. Optionally, a voltage level of the common voltage signal is lower than a voltage level of the gate scanning signal.

In some embodiments, the data signal is configured to turn on the third thin film transistor, allowing a current to flow from the third source electrode to the third drain electrode thereby increasing a voltage level at the second gate electrode from the voltage level of the common voltage signal by an increment value.

In some embodiments, the gate scanning signal is configured to turn on the first thin film transistor, allowing the data signal to be transmitted to the pixel electrode through the first thin film transistor. The second thin film transistor is configured to have a drain-source threshold voltage greater than a voltage difference between the second source electrode and the second drain electrode when the data signal is transmitted to the pixel electrode through the first thin film transistor, thereby maintaining the second thin film transistor in an OFF state.

In some embodiments, the gate scanning signal fails to turn on the first thin film transistor, and the data signal fails to be transmitted to the pixel electrode through the first thin film transistor. The second thin film transistor is configured to have a drain-source threshold voltage smaller than a voltage difference between the second source electrode and the second drain electrode when the gate scanning signal fails to turn on the first thin film transistor, thereby turning on the second thin film transistor and allowing the data signal to be transmitted to the pixel electrode through the second thin film transistor.

Figure 9:
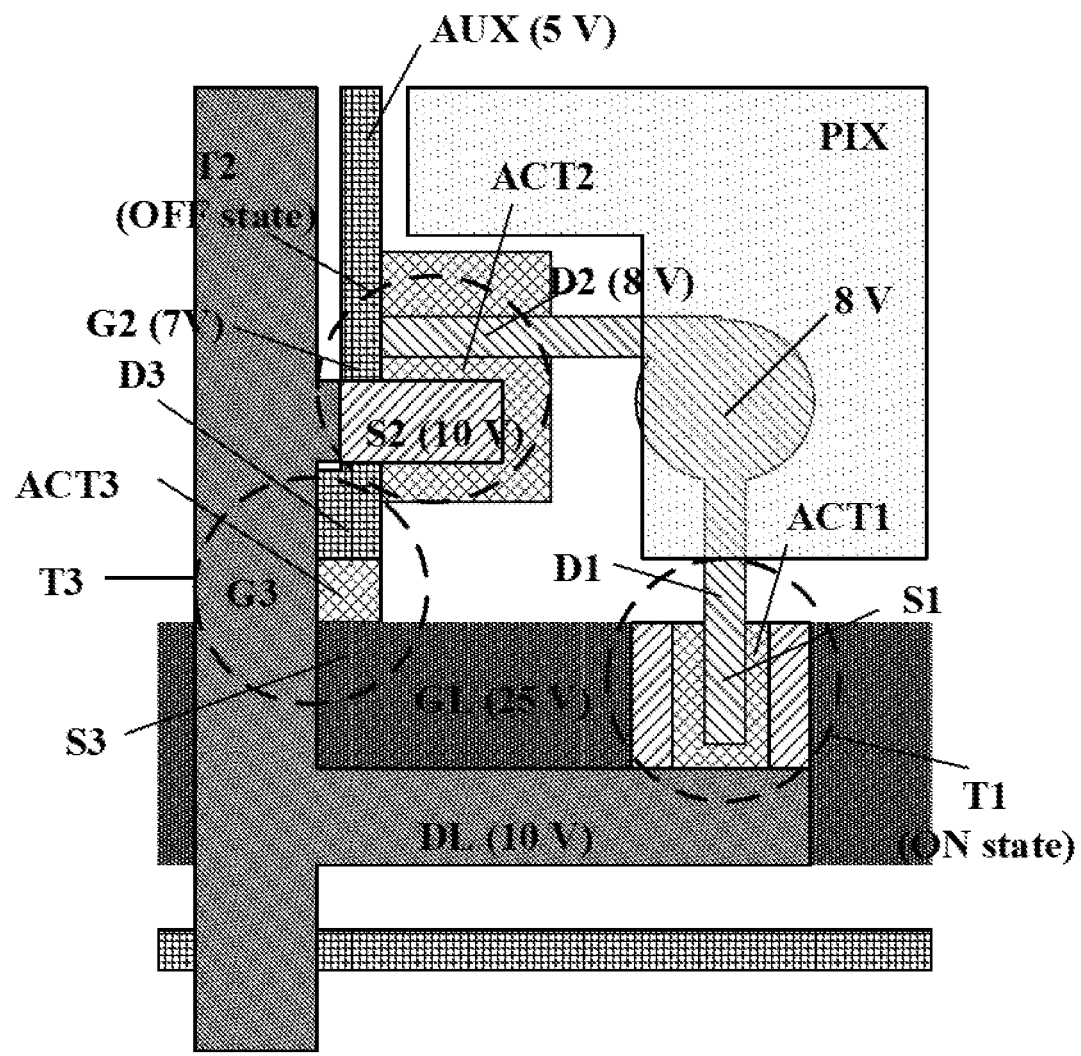
FIG. 9 depicts an operation scheme when a first thin film transistor is functional in a display apparatus in some embodiments according to the present disclosure.

FIG. 9 depicts an operation scheme when a first thin film transistor is functional in a display apparatus in some embodiments according to the present disclosure. Referring to FIG. 9, in one example, the gate scanning signal provided by the plurality of gate lines GL has a voltage level of 25 V, the data signal provided by the plurality of data lines DL has a voltage level of 10 V. and the common voltage provided by the plurality of auxiliary signal lines AUX has a voltage level of 5 V. When the first thin film transistor T1 is functional, the gate scanning signal turns on the first thin film transistor T1, the data signal is transmitted to the pixel electrode PIX through the first drain electrode D1. In one example, a voltage level at the pixel electrode PIX is 8 V, the subpixel associated with the first thin film transistor T1 is configured to emit light for image display.

Referring to FIG. 9 again, when the first thin film transistor T1 is functional and when the data signal is transmitted to the one of the plurality of data lines DL, the gate voltage at the third gate electrode G3 (which is a portion of the one of the plurality of data lines DL) is 10 V, which induces a restricted source-drain current between the third source electrode S3 (having a gate scanning voltage of 25 V) to the third drain electrode D3 (connected to the one of the plurality of auxiliary signal lines AUX), thereby slightly increasing the voltage level at the third drain electrode D3, e.g., from 5 V to 7 V. The third drain electrode D3 is connected to the second gate electrode G2. Thus, the gate voltage applied to the second gate electrode G2 is 7 V, which is higher than the threshold voltage of the second thin film transistor T2. The voltage level at the second source electrode S2 is the same as the data signal e.g., 10 V. The voltage level at the second drain electrode D2, as discussed above, is 8 V. The voltage difference between the second source electrode S2 and the second drain electrode D2 of the second thin film transistor T2 is 2 V, which is smaller than a drain-source threshold voltage (3 V) of the second thin film transistor T2. Accordingly, the second thin film transistor T2 fails to turn on, and remains in an OFF state. The light emission in the subpixel is driven by the first thin film transistor T1.

Figure 10:
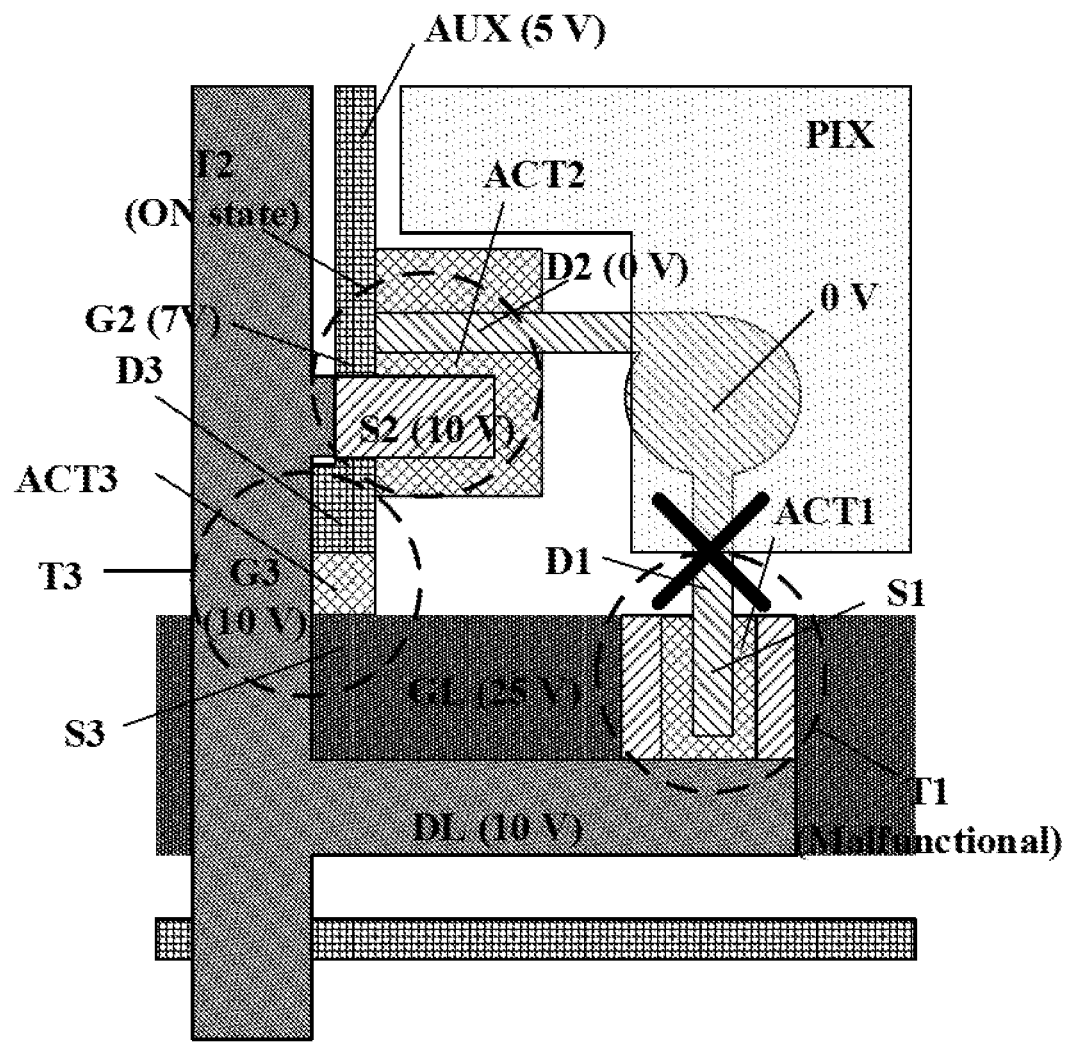
FIG. 10 depicts an operation scheme when a first thin film transistor is malfunctional in a display apparatus in some embodiments according to the present disclosure.

FIG. 10 depicts an operation scheme when a first thin film transistor is malfunctional in a display apparatus in some embodiments according to the present disclosure. Referring to FIG. 10, in one example, the gate scanning signal provided by the plurality of gate lines GL has a voltage level of 25 V, the data signal provided by the plurality of data lines DL has a voltage level of 10 V, and the common voltage provided by the plurality of auxiliary signal lines AUX has a voltage level of 5 V. When the first thin film transistor T1 is malfunctional, the gate scanning signal fails to turn on the first thin film transistor T1, the data signal is not transmitted to the pixel electrode PIX through the first drain electrode D1. As a result, a voltage level at the pixel electrode PIX is 0 V.

Referring to FIG. 10 again, when the first thin film transistor T1 is malfunctional and when the data signal is transmitted to the one of the plurality of data lines DL, the gate voltage at the third gate electrode G3 (which is a portion of the one of the plurality of data lines DL) is 10 V, which induces a restricted source-drain current between the third source electrode S3 (having a gate scanning voltage of 25 V) to the third drain electrode D3 (connected to the one of the plurality of auxiliary signal lines AUX), thereby slightly increasing the voltage level at the third drain electrode D3, e.g., from 5 V to 7 V. The third drain electrode D3 is connected to the second gate electrode G2. Thus, the gate voltage applied to the second gate electrode G2 is 7 V, which is higher than the threshold voltage of the second thin film transistor, thereby turning on the second thin film transistor T2. The voltage level at the second source electrode S2 is the same as the data signal, e.g., 10 V. The voltage level at the second drain electrode D2 is the same as that of the pixel electrode PIX, e.g., 0 V, due to the first thin film transistor T1 being malfunctional. The voltage difference between the second source electrode S2 and the second drain electrode D2 of the second thin film transistor T2 is 10 V, which is larger than a drain-source threshold voltage (3 V) of the second thin film transistor T2. Accordingly, the second thin film transistor T2 is turned on, and the data signal is transmitted to the pixel electrode PIX through the second drain electrode D2. The light emission in the subpixel is driven by the second thin film transistor T2.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate having a plurality of subpixel areas, comprising:
    a plurality of gate lines configured to provide a plurality of gate scanning signals respectively to the plurality of subpixel areas;
    a plurality of data lines configured to provide a plurality of data signals respectively to the plurality of subpixel areas;
    a plurality of auxiliary signal lines; and
    a pixel electrode;
    wherein the array substrate in each of the plurality of subpixel areas comprises:
    a first thin film transistor having a first active layer, a first gate electrode connected to one of the plurality of gate lines, a first source electrode connected to one of the plurality of data lines, and a first drain electrode connected to the pixel electrode;
    a second thin film transistor having a second active layer, a second gate electrode, a second source electrode connected to the one of the plurality of data lines, and a second drain electrode connected to the pixel electrode; and
    a third thin film transistor having a third active layer, a third gate electrode connected to the one of the plurality of data lines, a third source electrode connected to the one of the plurality of gate lines, and a third drain electrode connected to the second gate electrode and one of the plurality of auxiliary signal lines;
    wherein one or more of the first active layer, the second active layer, and the third active layer comprise a doped semiconductor material; and the third active layer is less doped than the first active layer and the second active layer.

2. The array substrate of claim 1, wherein the plurality of auxiliary signal lines are configured to be provided with a voltage having a voltage level lower than a voltage level of a gate scanning signal provided to the one of the plurality of gate lines.

3. The array substrate of claim 1, wherein a portion of the one of the plurality of auxiliary signal lines constitutes the second gate electrode.

4. The array substrate of claim 1, wherein a portion of the one of the plurality of data lines constitutes the third gate electrode.

5. The array substrate of claim 1, wherein a portion of the one of the plurality of auxiliary signal lines constitutes the third drain electrode.

6. The array substrate of claim 1, wherein a portion of the one of the plurality of gate lines constitutes the third source electrode.

7. The array substrate of claim 1, wherein a portion of the one of the plurality of auxiliary signal lines constitutes the second gate electrode;
   a portion of the one of the plurality of data lines constitutes the third gate electrode;
   a portion of the one of the plurality of auxiliary signal lines constitutes the third drain electrode; and
   a portion of the one of the plurality of gate lines constitutes the third source electrode.

8. A display apparatus, comprising the array substrate of claim 1, and a counter substrate facing the array substrate.

9. The display apparatus of claim 8, the display apparatus comprises having a plurality of subpixels; wherein the display apparatus is configured to:
   provide a gate scanning signal through the one of the plurality of gate lines to the first gate electrode and the third source electrode;
   provide a data signal through the one of the plurality of data lines to the first source electrode, the second source electrode, and the third gate electrode; and
   provide a common voltage signal through the one of the plurality of auxiliary signal lines to the third drain electrode;
   wherein a voltage level of the common voltage signal is lower than a voltage level of the gate scanning signal.

10. The array substrate of claim 1, wherein the first active layer comprises a first semiconductor sub-layer, a first doped semiconductor sub-layer on the first semiconductor sub-layer, a second semiconductor sub-layer on a side of the first doped semiconductor sub-layer distal to the first semiconductor sub-layer, and a second doped semiconductor sub-layer on a side of the second semiconductor sub-layer distal to the first doped semiconductor sub-layer;
   the third active layer comprises a third semiconductor sub-layer and a third doped semiconductor sub-layer on the third semiconductor sub-layer;
   the first semiconductor sub-layer and the third semiconductor sub-layer are in a same layer; and
   the first doped semiconductor sub-layer and the third doped semiconductor sub-layer are in a same layer.

11. The array substrate of claim 1, wherein the first active layer, the second active layer, and the third active layer are in a same layer.

12. An array substrate having a plurality of subpixel areas, comprising:
   a plurality of gate lines configured to provide a plurality of gate scanning signals respectively to the plurality of subpixel areas;
   a plurality of data lines configured to provide a plurality of data signals respectively to the plurality of subpixel areas;
   a plurality of auxiliary signal lines; and
   a pixel electrode;
   wherein the array substrate in each of the plurality of subpixel areas comprises:
   a first thin film transistor having a first active layer, a first gate electrode connected to one of the plurality of gate lines, a first source electrode connected to one of the plurality of data lines, and a first drain electrode connected to the pixel electrode;
   a second thin film transistor having a second active layer, a second gate electrode, a second source electrode connected to the one of the plurality of data lines, and a second drain electrode connected to the pixel electrode; and
   a third thin film transistor having a third active layer, a third gate electrode connected to the one of the plurality of data lines, a third source electrode connected to the one of the plurality of gate lines, and a third drain electrode connected to the second gate electrode and one of the plurality of auxiliary signal lines;
   wherein the first active layer comprises a first semiconductor sub-layer, a first doped semiconductor sub-layer on the first semiconductor sub-layer, a second semiconductor sub-layer on a side of the first doped semiconductor sub-layer distal to the first semiconductor sub-layer, and a second doped semiconductor sub-layer on a side of the second semiconductor sub-layer distal to the first doped semiconductor sub-layer;
   the third active layer comprises a third semiconductor sub-layer and a third doped semiconductor sub-layer on the third semiconductor sub-layer;
   the first semiconductor sub-layer and the third semiconductor sub-layer are in a same layer; and
   the first doped semiconductor sub-layer and the third doped semiconductor sub-layer are in a same layer.

13. The array substrate of claim 12, wherein the first doped semiconductor sub-layer and the third doped semiconductor sub-layer are less doped than the second doped semiconductor sub-layer.

14. The array substrate of claim 12, wherein the second active layer comprises a fourth semiconductor sub-layer, a fourth doped semiconductor sub-layer on the fourth semiconductor sub-layer, a fifth semiconductor sub-layer on a side of the fourth doped semiconductor sub-layer distal to the fourth semiconductor sub-layer, and a fifth doped semiconductor sub-layer on a side of the fifth semiconductor sub-layer distal to the fourth doped semiconductor sub-layer;
   wherein the first semiconductor sub-layer and the fourth semiconductor sub-layer are in a same layer;
   the first doped semiconductor sub-layer and the fourth doped semiconductor sub-layer are in a same layer;
   the second semiconductor sub-layer and the fifth semiconductor sub-layer are in a same layer; and
   the second doped semiconductor sub-layer and the fifth doped semiconductor sub-layer are in a same layer.

15. The array substrate of claim 14, wherein the fourth doped semiconductor sub-layer and the third doped semiconductor sub-layer are less doped than the fifth doped semiconductor sub-layer.

16. The array substrate of claim 14, wherein the first active layer further comprises a first insulating sub-layer between the first doped semiconductor sub-layer and the second semiconductor sub-layer;

the second active layer further comprises a second insulating sub-layer between the fourth doped semiconductor sub-layer and the fifth semiconductor sub-layer; and
the first insulating sub-layer and the second insulating sub-layer are in a same layer and comprise a same material.

17. The array substrate of claim 12, the first active layer further comprises a first insulating sub-layer between the first doped semiconductor sub-layer and the second semiconductor sub-layer.

18. An array substrate having a plurality of subpixel areas, comprising:
a plurality of gate lines configured to provide a plurality of gate scanning signals respectively to the plurality of subpixel areas;
a plurality of data lines configured to provide a plurality of data signals respectively to the plurality of subpixel areas;
a plurality of auxiliary signal lines;
a pixel electrode; and
a common electrode;
wherein the array substrate in each of the plurality of subpixel areas comprises:
a first thin film transistor having a first active layer, a first gate electrode connected to one of the plurality of gate lines, a first source electrode connected to one of the plurality of data lines, and a first drain electrode connected to the pixel electrode;
a second thin film transistor having a second active layer, a second gate electrode, a second source electrode connected to the one of the plurality of data lines, and a second drain electrode connected to the pixel electrode; and
a third thin film transistor having a third active layer, a third gate electrode connected to the one of the plurality of data lines, a third source electrode connected to the one of the plurality of gate lines, and a third drain electrode connected to the second gate electrode and one of the plurality of auxiliary signal lines;
wherein the plurality of auxiliary signal lines are a plurality of common electrode signal lines; and
the common electrode is connected to one of the plurality of auxiliary signal lines.

19. The array substrate of claim 18, wherein one or more of the first active layer, the second active layer, and the third active layer comprise a doped semiconductor material; and
the third active layer is less doped than the first active layer and the second active layer.

20. The array substrate of claim 18, wherein the first active layer comprises a first semiconductor sub-layer, a first doped semiconductor sub-layer on the first semiconductor sub-layer, a second semiconductor sub-layer on a side of the first doped semiconductor sub-layer distal to the first semiconductor sub-layer, and a second doped semiconductor sub-layer on a side of the second semiconductor sub-layer distal to the first doped semiconductor sub-layer;
the third active layer comprises a third semiconductor sub-layer and a third doped semiconductor sub-layer on the third semiconductor sub-layer;
the first semiconductor sub-layer and the third semiconductor sub-layer are in a same layer; and
the first doped semiconductor sub-layer and the third doped semiconductor sub-layer are in a same layer.

* * * * *